(12) United States Patent
Runde et al.

(10) Patent No.: US 9,025,131 B2
(45) Date of Patent: May 5, 2015

(54) OPTICAL BEAM DEFLECTING ELEMENT, ILLUMINATION SYSTEM INCLUDING SAME, AND RELATED METHOD

(75) Inventors: Daniel Runde, Satteldorf (DE); Florian Doll, Puchheim (DE); Reinhard Voelkel, Neuchatel (CH); Kenneth Weible, Neuchatel (CH); Gundula Weiss, Aalen (DE); Michael Gerhard, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 339 days.

(21) Appl. No.: 13/358,158

(22) Filed: Jan. 25, 2012

(65) Prior Publication Data

US 2012/0249988 A1  Oct. 4, 2012

Related U.S. Application Data

(63) Continuation of application No. PCT/EP2009/005555, filed on Jul. 31, 2009.

(51) Int. Cl.
*G03B 27/54* (2006.01)
*G03F 7/20* (2006.01)

(52) U.S. Cl.
CPC ........ *G03F 7/70191* (2013.01); *G03F 7/70108* (2013.01); *G03F 7/70158* (2013.01)

(58) Field of Classification Search
CPC ............ G03F 7/70108; G03F 7/70158; G03F 7/70191
USPC .................. 355/67, 53, 77; 359/196.1, 204.5, 359/211.6, 204.1
See application file for complete search history.

(56) References Cited

U.S. PATENT DOCUMENTS

| 6,535,274 | B2 | 3/2003 | Antoni |
| 7,292,393 | B2 | 11/2007 | Kvamme |
| 7,551,261 | B2 | 6/2009 | Fiolka |
| 7,714,983 | B2 | 5/2010 | Koehler et al. |
| 2003/0214643 | A1 | 11/2003 | Eurlings et al. |
| 2006/0164711 | A1 | 7/2006 | Govil et al. |
| 2007/0024836 | A1 | 2/2007 | Singer et al. |
| 2007/0058151 | A1 | 3/2007 | Eurlings et al. |
| 2007/0165202 | A1 | 7/2007 | Koehler et al. |
| 2007/0279535 | A1 | 12/2007 | Fiolka |

(Continued)

FOREIGN PATENT DOCUMENTS

| EP | 0 949 541 | 10/1999 |
| EP | 1 109 067 A2 | 6/2001 |

(Continued)

OTHER PUBLICATIONS

Japanese Office Action, with translation thereof, for corresponding JP Appl. No. 2012-521970, dated Jun. 7, 2013.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

An optical beam deflecting element may be used effectively as an energy distribution manipulator in an illumination system to vary the energy distribution within a given spatial intensity distribution in a pupil plane of the illumination system substantially without changing the shape and size and position of illuminated areas in the pupil plane.

24 Claims, 16 Drawing Sheets

(56) References Cited

U.S. PATENT DOCUMENTS

2008/0013065 A1 1/2008 Kohl
2008/0062509 A1 3/2008 Uemura
2008/0284998 A1 11/2008 Geh et al.
2010/0195077 A1 8/2010 Koehler et al.

FOREIGN PATENT DOCUMENTS

| JP | 2007-505488 | 3/2007 |
|---|---|---|
| JP | 2009-111223 | 5/2009 |
| WO | WO 2005/026843 | 3/2005 |
| WO | WO 2005/083512 | 9/2005 |
| WO | WO 2009/057822 | 5/2009 |

OTHER PUBLICATIONS

International Preliminary Report on Patentability from the counterpart PCT Application No. PCT/EP2009/005555, dated Jan. 21, 2012.
International Search Report and a Written Opinion from the counterpart PCT Application No. PCT/EP2009/005555, dated Apr. 22, 2010.

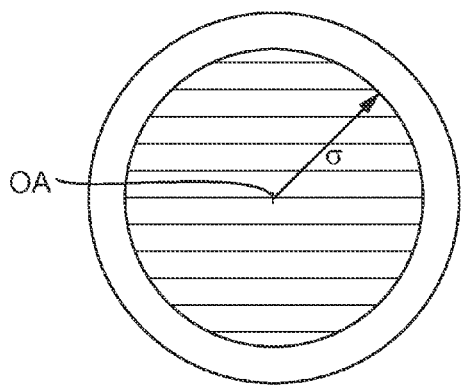
Fig. 2A
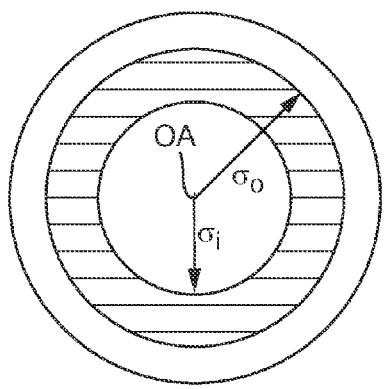
Fig. 2B
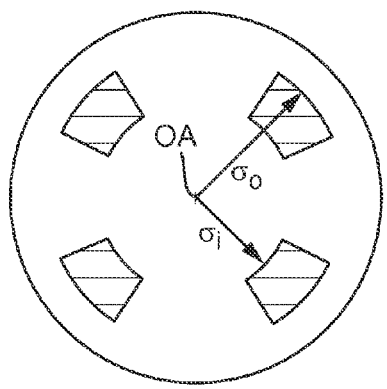
Fig. 2C
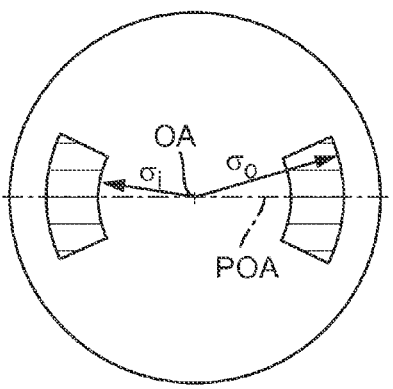
Fig. 2D
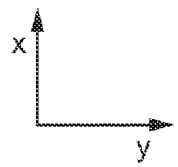

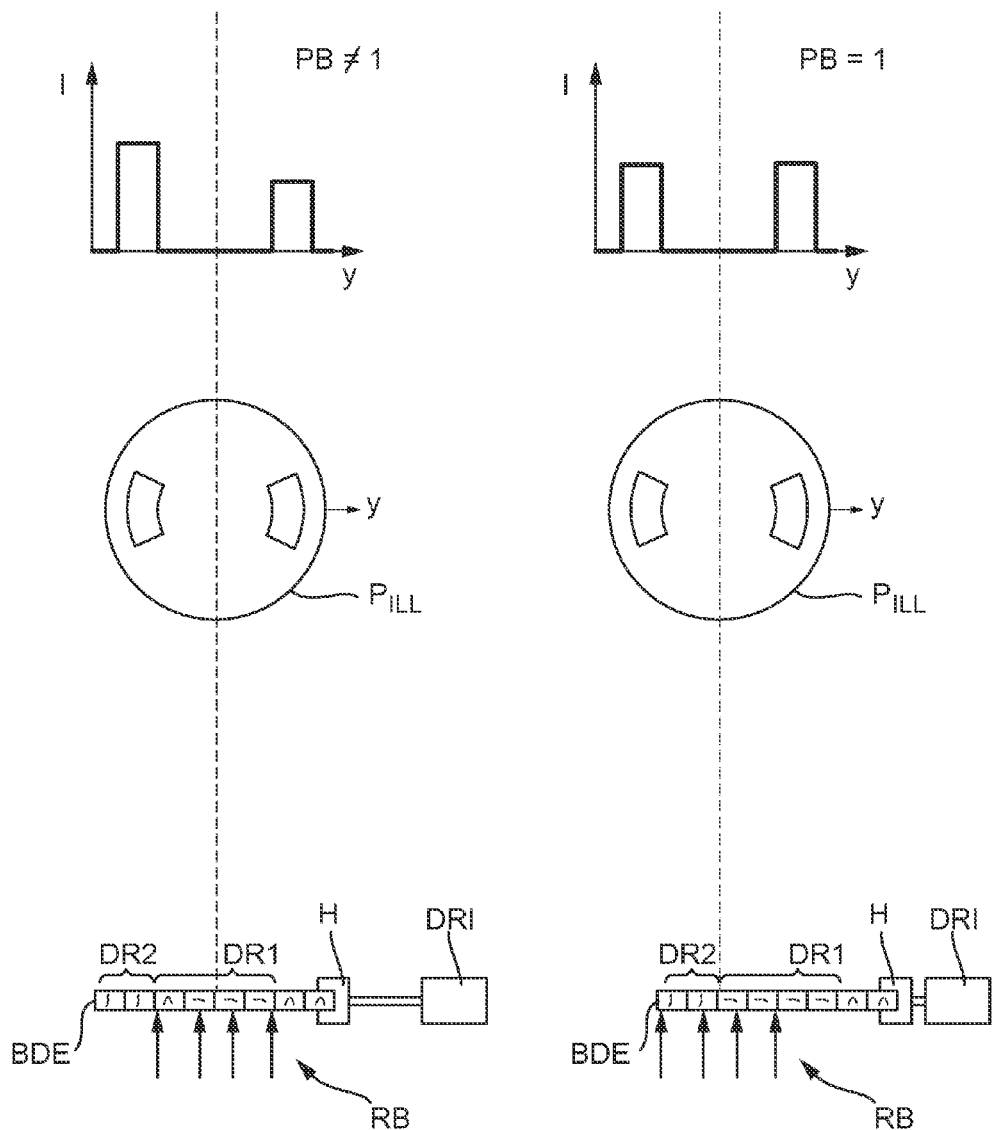

OPTICAL BEAM DEFLECTING ELEMENT, ILLUMINATION SYSTEM INCLUDING SAME, AND RELATED METHOD

CROSS-REFERENCE TO RELATED APPLICATIONS

This application is a continuation of, and claims benefit under 35 USC 120 to, international application PCT/EP2009/005555, filed Jul. 31, 2009. International application PCT/EP2009/005555 is hereby incorporated by reference in its entirety.

FIELD

The disclosure relates to an optical beam deflecting element for generating a radiation beam having rays with a predefined angular distribution by changing an angular distribution of rays in a radiation beam incident on the beam deflecting element. The disclosure also relates to an illumination system including such a beam deflecting element and to a method of adjusting imaging properties of a projection exposure system.

BACKGROUND

Microlithographic projection exposure methods and systems are used for fabricating semiconductor components and other finely structured components. Use is made of masks (reticles) that bear or form a pattern of a structure to be imaged, for example a line pattern of a layer of a semiconductor component, such as an integrated circuit (IC). A mask is positioned in a projection exposure system between an illumination system and projection objective in the region of the object surface of the projection objective, and illuminated with illumination radiation provided by the illumination system. The radiation varied by the mask and the pattern forms projection radiation propagating through the projection objective, which images the pattern onto the substrate to be exposed. The substrate normally bears a radiation-sensitive layer (photoresist).

It is known that the image of a pattern provided by the mask can be improved, and the process windows can be enlarged, by appropriate choice of the angular distribution of rays at which the pattern of the mask is illuminated by the illumination system. The angular distribution of rays impinging on the mask is usually adapted to the kind of pattern to be projected onto the substrate. For example, relatively large sized features may involve different angular distribution than small sized features. Ideally, the illumination system illuminates each point of an illuminated field on the mask with rays having a well defined angular distribution.

The term "angular distribution" of rays incident on a point on a mask is generally used to describe which illumination directions (or angles) contribute to the illumination and how the total energy of a ray bundle, which converges towards a particular point in the mask plane, is distributed among the various directions along which the rays constituting the ray bundle propagate. The term "ray" as used in this application corresponds to a "radiation bundle" propagating in a given direction and transporting a certain amount of radiation energy.

In certain types of illumination systems the angular distribution of radiation illuminating the mask is determined by the spatial intensity distribution in a pupil plane of the illumination system, which can be regarded as a secondary (or effective) source. In those systems, particular illumination modes are commonly described by reference to the shape of the spatial intensity distribution in the pupil plane. A set of principal illumination modes (corresponding to a set of principal shapes of the spatial intensity distribution in the pupil plane) is commonly used to characterize various illumination modes. One principal illumination mode is the "conventional illumination", which corresponds to an even illumination of a mask point from all angles from 0° to a certain maximum angle, and which involves a uniform disk-shaped spatial intensity distribution in the pupil plane. Another commonly-used principal intensity distribution is "annular illumination", in which the intensity distribution in the pupil plane is an annulus, with no intensity in the center of the pupil. Other principal illumination modes are "dipole illumination", in which there are two intensity poles in the pupil plane, "quadrupole illumination", in which there are four intensity poles in the pupil plane, or other multipole illumination settings, such as, for example, having 6 or 9 or more poles.

Within this disclosure, a preselected type of spatial intensity distribution at the pupil plane of the illumination system, which corresponds to one of the principal illumination modes, or to a combination of two or more spatial intensity distributions of principal illumination modes, may be referred to as an "illumination setting".

To create different illumination settings, various methods have been proposed. For example, a zoom-axicon (a combination of a zoom system and an axicon system) can be used to optionally create conventional illumination with a controllable maximum angle, or annular illumination with controllable inner and outer radii of the annulus. To create dipole and quadrupole type illumination settings, it has been proposed to use spatial filters, i.e. opaque plates with apertures located where the poles are desired, or other light shielding elements. Using spatial filters is often undesirable because the resulting loss of radiation can reduce the throughput of the apparatus.

It has therefore been proposed to employ an optical beam deflecting element, such as for example a diffractive optical element (DOE) or refractive optical element, in the process of forming a desired intensity distribution in the pupil plane of the illumination system. In general, an optical beam deflecting element is placed in the beam path of the illumination system between a primary radiation source associated with the illumination system and the pupil plane forming the effective (secondary) source. In operation, the optical beam deflecting element redirects radiation and thereby changes an angular distribution of rays in a radiation beam incident on the beam deflecting element to generate a radiation beam having rays according to a predefined angular distribution. In other words, the optical beam deflecting element changes in a controlled manner the angular spectrum and energy distribution of radiation interacting with the optical beam deflecting element. In this process, radiation energy is redirected rather than blocked, such that radiation loss can be minimized. By positioning an optical beam deflecting element upstream of the pupil surface and placing a condenser lens system in between, it is possible to produce almost any arbitrary spatial intensity distribution in the pupil surface. If desired, an additional zoom-axicon system makes it possible to vary, at least to a limited extent, the spatial intensity distribution produced by the optical beam deflecting arrangement.

European patent applications EP 0 949 541 A and EP 1 109 067 A (corresponding to US 2003/0214643 A1) describe, among other things, diffractive optical elements in which different regions may have different effects, for example, forming quadrupole or conventional illumination modes so that mixed or "soft" illumination modes can be created.

US 2007/0058151 A1 describes similar diffractive optical elements which further include polarization influencing structures ensuring that radiation redirected into specified directions has a defined polarization.

U.S. Pat. No. 7,292,393 B2 describes a variable illuminator including a diffractive optical element in which different annular sections have different structures to create different spatial illumination profiles at a pupil plane of the illuminator. The sections can be placed selectively into an incident laser beam by rotating the diffractive optical element.

US 2007/0024836 A1 describes illumination systems having three diffractive optical elements which, in combination, influence the angular distribution of a light bundle incident on a mask.

A defined distribution of ray angles in an illumination beam directed at a mask is only one of multiple desired properties for a lithographic process. Other desired properties relate to the distribution of radiation energy (or intensity) over the rays of a ray bundle, which may be characterized using one or more energy distribution parameters.

One property sometimes desire for an illumination system is a good pole balance. The term "pole balance" refers to a parameter which specifies how radiation energy is distributed between two sides of a dividing plane which subdivides the pupil plane centrally. In polar illumination settings, the parameter pole balance (PB) may be employed to quantify how radiation energy is distributed between two diametrically opposed poles of a multipolar illumination setting.

Another property often desired from highly advanced illumination systems is a good ellipticity. In one definition, the term "ellipticity" refers to a parameter which specifies how radiation energy is distributed along regions centered about two mutually orthogonal directions, such as x-direction and y-direction in a plane perpendicular to the optical axis (z-direction) or about axes running centrally between the x and y directions in diagonal direction. The ellipticity is often used to qualify energy distributions in annular or hexagonal or conventional illumination settings.

Another energy distribution parameter sometimes used to quantify the distribution of radiation energy over the rays of an illumination beam is denoted as "gradient". The gradient may be defined to quantify a two-dimensional energy disparity, i.e. a variation of intensity along one reference axis in the pupil plane. The variation of intensity along that axis may be described by a parameter which changes along the reference axis.

Another energy distribution parameter sometimes used to describe the distribution of radiation energy over the rays of an illumination beam incident on an illuminated area is denoted as "telecentricity". In one definition the term "telecentricity" is used in the sense of "energetic telecentricity" and refers to the direction (or angle) in space of an energetic centroid of bundle of rays converging towards a given point in an illuminated area. The energetic centroid represents the average of all propagation directions present in the ray bundle, weighted by the respective amounts of energy (or intensity) travelling in the respective propagation directions. The telecentricity parameter therefore relates to the extent different directions in space contribute to the overall intensity incident on a specific point.

It is understood that any spatial distribution of illumination intensity in a plane can be characterized using one or more of the above energy distribution parameters, and that energy distribution parameters according to other definitions may also be used to qualify the spatial distribution of illumination intensity in the pupil plane, or another property related thereto, such as a balance of radiation energy (or intensity) in a ray bundle converging on a point in the mask plane.

Correction of errors in illumination energy distribution is conventionally achieved by using appropriate attenuation techniques, such as pupil filtering. US 2008/0284998 A1 discloses the use of a variable pupil filter having a plurality of radially movable spokes in combination with a decentering of a lens to correct pole balance errors generated by an illumination system. A variable pupil filter suitable for adapting the illumination angle distribution in a projection exposure apparatus is disclosed in U.S. Pat. No. 6,535,274 B2.

Structured illumination employing particular illumination settings adapted to given patterns to be imaged has helped to significantly improve the quality of the lithographic process. However, it has been observed that a certain quality of the imaging process expected from calculations can not always be obtained even though the same illumination setting is used for the same type of mask and pattern in roughly identical or similar projection exposure systems operated with the same nominal operating conditions, such as operating wavelength $\lambda$, image-side numerical aperture NA and other process determining parameters. For example, where large quantities of similar components are manufactured in a manufacturing plant, several projection exposure systems are usually run in parallel performing nominally the same lithographic process to increase throughput. Although similar results would be expected in the printed products, variations in product quality have been observed although the same type of projection systems with the same projection parameters have been used in combination with masks bearing the same type of patterns.

SUMMARY

The disclosure provides projection exposure systems and components for projection exposure systems which can improve the quality of manufactured products when using structured illumination.

An optical beam deflecting element according to this formulation allows for a fine tuning of the distribution of radiation energy over the rays of a ray bundle substantially without changing the geometric distribution of propagation directions (ray angles) within the ray bundle. During operation of the optical beam deflecting element, a radiation beam incident on the optical beam deflecting element may hit first deflecting structures of the beam deflecting element in one or more first deflecting regions. The interaction of the rays of the incident radiation beam with the first deflecting structures generates a distribution of ray angles of the exiting radiation such that first rays have propagation directions corresponding to ray angles within a predefined distribution of ray angles. Typically, ray angles which have not been present in the incident radiation beam are generated by the beam deflecting element. For example, if the optical beam deflecting element is positioned in a region of largely collimated radiation of the incident radiation beam, the beam deflecting element may increase the divergence of the radiation.

Each first ray in the first bundle of first rays exiting the first deflecting structures has a specific propagation direction determined by the first deflecting structures, and a particular first intensity, which is also determined by the first deflecting structures. The geometric distribution of ray angles of propagation directions of the first rays may be described with a predefined distribution of ray angles for which the optical beam deflecting element has been designed. The intensity or energy of the first ray bundle is distributed over the first rays in a particular way described by the first intensity distribution, which associates with each angle (propagation direction) present in the predefined distribution of ray angles a particular first intensity value.

In the same or another operation mode, the incident radiation beam may illuminate second deflecting structures arranged in one or more second deflecting region(s) arranged laterally offset relative to the first deflecting region(s). If illuminated, the second deflecting structures generate a second bundle of second rays. Each second ray has a propagation direction which corresponds to a ray angle within the predefined distribution of ray angles which is also given for the first rays generated by the first deflecting structures. Therefore, the predefined distribution of ray angles is substantially the same in both operation modes of the beam deflecting element.

However, the second rays have second intensities according to a second intensity distribution, which differs significantly from the first intensity distribution. With other words: the distribution of ray angles is substantially the same irrespective of whether the first deflecting region or the second deflecting region is illuminated by the incident radiation beam. However, the distribution of radiation energy over the rays in the exiting bundle of rays changes in a predefined manner when the illumination is shifted from the first deflecting region(s) to the second deflecting region(s) (or vice versa).

The effect of the optical beam deflecting element may also be described in terms of illumination settings which can be generated if the optical beam deflecting element is introduced in a radiation beam path between a primary light source of an illumination system and a pupil plane of the illumination system (or a plane in the far field of the optical beam deflecting element). The angular distribution generated by the optical beam deflecting element transforms to a spatial intensity distribution in the pupil plane (or in the far field of the beam deflecting element). Speaking in terms of illumination settings, the optical beam deflecting element generates a particular illumination setting when the first deflecting structures are illuminated, and the illumination setting remains substantially unchanged if the second deflecting structures are illuminated instead of the first deflecting structures or in addition thereto. However, when the incident radiation is shifted from the first deflecting structures to the second deflecting structure (or vice versa), the distribution of local intensities within the spatial intensity distribution varies in a targeted manner defined by the structural differences between the first deflecting structures and the second deflecting structures of the beam deflecting element and the relative areas of first and second deflecting structures subject to an incident radiation beam. An energy conserving redistribution of radiation energy in a given illumination setting is thereby obtained.

In the context of this application, two different illumination modes which can be generated with the same beam deflecting element are denoted as corresponding to "substantially the same setting", if the number and general arrangement of contiguous illuminated zones in the pupil surface of an illumination system does not change between different operating modes of the beam deflecting element. In particular, two settings are "substantially the same setting", if substantially no ray angles (propagation directions of radiation energy) are added or disappear completely when the illumination mode is changed from a first to a second illumination mode.

For example, an embodiment of a beam deflecting element may be designed to vary the spatial intensity distribution in a conventional illumination setting (circular disc shaped illuminated zone in the pupil surface) such that the size (radius) of the illuminated zone stays substantially the same in various operation modes of the beam deflecting element, while the energy distribution may be changed substantially, for example by shifting energy from one side of a dividing plane towards the other in order to improve pole balance. Minor changes of the radius of the illuminated disc (parameter $\sigma$) in the order of 2% or less or 1% or less or 0.5% or less may be allowed within substantially the same setting.

Where an embodiment of a beam deflecting element is designed to generate dipole illumination, different dipole settings may be considered as substantially the same setting if the radial width $\Delta\sigma$ of the illumination poles does not vary by more than 2% and if a pole width of the poles measured in azimuthal direction does not vary by more than 1° between different operation modes of the beam deflecting element.

If a beam deflecting element is used in combination with axicon elements or a zoom axicon system to generate an annular illumination setting, the annular illumination settings are "substantially the same settings" if the axicon elements remain in a fixed position between different operation modes of the beam deflecting element and a radial width of the annulus ($\Delta\sigma$) does not vary by more than 2% between different operation modes of the beam deflecting element. Analogous definitions hold for other multipolar illumination settings, such as quadrupole illumination.

Further, in the context of this application a first intensity distribution differs from a second intensity distribution if the difference is substantially greater than a difference expected from manufacturing tolerances when manufacturing the nominally identical deflecting structures.

On the other hand, if there is a certain desired amount or radiation energy in a certain propagation direction in the first intensity distribution, there will generally also be a certain finite amount of radiation energy travelling in the same direction when the second intensity distribution is set. The change in intensity between the different modes is usually relatively small. For example, the intensities for a given propagation direction of radiation in a first intensity distribution and a second intensity distribution usually do not differ by more than 50% or 40% or 30% or less. For example, if radiation travelling in a certain propagation direction has 100% intensity in the first intensity distribution, the same "ray" or propagation direction will usually have at least 50% or at least 60% or at least 70% intensity in the second intensity distribution, and vice versa.

In general, a "deflecting region" may be formed by a single cell having a given deflecting structure or by an arrangement of identical cells, each having the same deflecting structure, which is thereby multiply repeated in the cells of the deflecting region to form a regular or irregular array of cells of a deflecting region. Identical cells of a deflecting region may be arranged side by side or spaced apart from each other.

Refractive deflecting structures, i.e. deflecting structures configured to refract (as opposed to diffract) light, are possible. It is often preferred if the deflecting structures are formed by diffractive structures such as diffraction grating structures which redirect radiation by diffraction rather than refraction. Employing diffractive structures allows very fine adjustment of ray angles and intensities in the deflected beams. Where the beam deflecting element contains diffractive structures, it may also be denoted as diffractive optical element (DOE). In particular, the diffractive optical element can be a Computer Generated Hologramm (CGH).

Different types of deflecting structures may be combined in one beam deflecting element. For example, refractive deflecting structures may be combined with diffractive structures. It is also possible to combine different types of diffractive structures which may include computer generated hologram structures, which are also denoted CGH structures. In some embodiments an optical beam deflecting element includes an array of Fresnel zone structures and a plurality of diffractive CGH structures formed in interspaces between the Fresnel zone structures. Fresnel zone structures may form the main structures of the beam deflecting element redirecting light with high efficiency. The CGH structures provided in addition to Fresnel zone structures may be utilized as energy adjustment structures providing modifications of the basic energy distribution generated by the Fresnel zone structures. In general, a Fresnel zone structure may be designed as a phase-step structure introducing in a targeted fashion phase shifts between rays propagating through neighbouring zones of different phase thickness. Phase-step Fresnel structures may be preferred because the energy loss is minimized. Alternatively, Fresnel zone structures may be designed as greytone structures providing different levels of attenuation in concentric zones.

A beam deflecting element including an array of Fresnel zone structures and a plurality of diffractive CGH structures formed in interspaces between the Fresnel zone structures may also have utilities other than described in the present application. For example, such beam deflecting element may be configured to change illumination settings depending on which partial area of the beam deflecting element is subject to an incident radiation beam.

First and second deflecting regions may be arranged directly adjacent to each other or spatially separated. The deflecting structure within cells of a deflecting region can be formed such that no structural discontinuity is present in a border region between adjacent cells. Where a continuous transition of structures occurs between immediately adjacent cells, intensity variations possibly occurring at discontinuous borders may be avoided. It is also possible that there is a structural discontinuity between adjacent cells. In general, this type of structures give larger degrees of freedom to design the deflecting structures within the neighbouring cells.

The second deflecting region may be arranged adjacent to the first deflecting region at one side in a first direction and a third deflecting region may be arranged adjacent to the first deflecting region at an opposite side along the first direction, wherein the third deflecting region includes third deflecting structures generating a third bundle of third rays, each of the third rays having a propagation direction corresponding to a ray angle within the predefined distribution of ray angles, the third rays having third intensities according to a third intensity distribution different from the first and second intensity distributions. In those embodiments, a relative displacement between an incident radiation beam and the beam deflecting element parallel to the first direction allows to select between three or more different intensity distributions within a given geometric distribution of ray angles. A pure first intensity distribution may be obtained if only first deflecting structures are illuminated. A linear combination of first and second intensity distributions may be obtained if respective fractions of first and second deflecting structures are illuminated. Likewise, a linear combination of first and third intensity distributions may be obtained if both first and third deflecting structures are illuminated with a respective area fraction.

More than three different types of deflecting regions generating more than three different intensity distributions may be provided in appropriate order in a first direction such that a gradual change of intensity distribution within a predefined distribution of ray angles may be obtained depending on which selection of deflecting structures is illuminated to a predefined extent.

In some embodiments the second deflecting structures and the third deflecting structures are designed to influence at least one energy distribution parameter defined for the predefined annular distribution in mutually opposite ways. For example, a reference pole balance may be generated if only first deflecting structures are illuminated. Pole balance may be increased relative to the reference situation if first and second deflecting structures (or only second deflecting structures) are illuminated, while pole balance may be decreased relative to the reference situation if first and third deflecting structures (or only third deflecting structures) are illuminated. Relative movement of the beam deflecting element and/or the incident radiation beam parallel to the first direction can therefore be utilized as manipulator for the respective energy distribution parameter, such as pole balance, or ellipticity or gradient.

In some embodiments, the beam deflecting element further includes a fourth deflecting region arranged adjacent to the first deflecting region at one side in a second direction transverse to the first direction, the fourth deflecting region including fourth deflecting structures generating a fourth bundle of fourth rays, each of the fourth rays having a propagation direction corresponding to a ray angle within the predefined distribution of ray angles, the fourth rays having fourth intensities according to a fourth intensity distribution different from the first, second and third intensity distributions. Those embodiments offer further degrees of freedom for manipulating the energy distribution within an spatial intensity distribution generated by the beam deflecting element, because a relative movement of incident radiation and beam deflecting element along the second direction may be utilized to influence the overall intensity distribution with contributions of the fourth intensity distribution depending on the areal fraction of fourth deflecting structure which are illuminated by the incident radiation beam. The beam deflecting element may further include a fifth deflecting region arranged adjacent to the first deflecting region at an opposite side along the second direction, the fifth deflecting region including fifth deflecting structures generating a fifth bundle of fifth rays, each of the fifth rays having a propagation direction corresponding to a ray angle within the predefined distribution of ray angles, the fifth rays having fifth intensities according to a fifth intensity distribution different from the first, second, third and fourth intensity distributions. The fourth deflecting structures and the fifth deflecting structures may be designed to influence at least one energy distribution parameter defined by the predefined angular distribution in mutually opposite ways.

Those embodiments allow to influence two different energy distribution parameters (such as pole balance, ellipticity or gradient) independent of each other by relative displacement of the beam deflecting element and the incident radiation beam in the first direction and the second direction or in any other direction within a plane defined by the first and second direction.

First and second deflecting regions, and optional third, fourth and further deflecting regions may each form a single contiguous block (or cell group) of respective cells containing the deflecting structures. Therefore, in some embodiments, there is only one contiguous first deflecting region, only one contiguous second deflecting region and optionally further single contiguous deflecting regions generating other intensity distribution.

In other embodiments, the beam deflecting element includes a plurality of first deflecting regions arranged at spaced apart positions in a first periodic raster arrangement, and a plurality of second deflecting regions arranged at spaced apart positions laterally offset relative to the first deflecting regions in a second periodic raster arrangement. The second deflecting regions may be arranged between first deflecting regions to obtain an alternating arrangement of first and second (and optionally further) deflecting regions in one or more directions in the optically used area of the beam deflecting element.

In those embodiments, the deflecting structures of the first and second deflecting regions, and optionally of further deflecting regions may be distributed in a regular fashion in a one dimensional or two dimensional array across an entire optically used area of the beam deflecting element. Relatively large effective areas of a first deflecting region, the second deflecting region and optional further deflecting regions may therefore be arranged at relative small relative distance from each other such that only small relative displacements between the incident radiation and the beam deflecting element are used to shift between different operation modes in which the areal fraction of first and second deflecting regions contributing to the exiting radiation beam can be changed.

The raster arrangements of first and/or second deflecting regions may be addressed by subdividing an incident radiation beam into a plurality of partial beams forming a periodic raster arrangement of spatially separate illumination spots on the beam deflecting element.

Where the beam deflecting element is incorporated into a pupil shaping unit of an illumination system, the pupil shaping unit may include a beam separator configured to separate an incident radiation beam into a plurality of partial beams forming a periodic raster arrangement of spatially separated illumination spots on the beam deflecting element. In one operation mode of the beam deflecting element, all spots may be incident on first deflecting region only, for example. A small relative shift of the beam deflecting element may then be used to obtain a second operation mode where only second deflecting regions are illuminated by the incident partial beams. Optional further deflecting regions arranged in respective raster arrangements may also be addressed in a similar manner.

In more general terms, the illumination system may include a variable arrangement effective to generate a plurality of partial beams forming an arrangement of illumination spots on the beam deflecting element to illuminate selected regions of the beam deflecting element, wherein the arrangement is variably controllable in such a way that differing selected regions on the beam deflecting element are illuminated in differing operation modes of the arrangement. A selection between different modes of operation of the beam deflecting element utilizing differing deflecting regions can thereby be made.

Conveniently, the illumination system may include a drive system configured to move the beam deflecting element in a movement direction transverse to an incident direction of an incident radiation beam, e.g. perpendicular to an optical axis of the illumination system, such that the incident radiation beam, which may be contiguous or separated into a number of partial beams, addresses one or more desired regions of the beam deflecting element. Differing regions are addressable by actuating the drive system. Alternatively, it is possible to have the beam deflecting element in a fixed position and to shift or redistribute the incident radiation accordingly. In this case, a variably controllable deflecting arrangement may be arranged between a light source associated with the illumination system and the beam deflecting element.

In some embodiments, a predefined distribution of ray angles generated by the first and second deflecting structures corresponds to a multipolar spatial intensity distribution in a far field of the beam deflecting element, and the first and second intensity distributions differ in at least one of a pole balance, an ellipticity, and a gradient of intensity. Deflecting structures of other embodiments may be structured to influence other energy distribution parameters in a multipolar setting or in other illumination settings. For example, annular illumination may sometimes be desired with relatively narrow radial width $\Delta\sigma$ of the illumination annulus. In illumination systems with a zoom axicon system to influence the inner and outer radius of an annular setting, extreme configurations of the elements of the zoom axicon system may be desired to realise small $\Delta\sigma$ values. It has been observed that it may be difficult under these conditions to provide a relatively even illumination intensity of the annular zone. This fact is sometimes referred to as "pole smearing". Deflecting structures of beam deflecting element may be specifically designed to counteract this effect by deflecting radiation predominantly in those areas of an annulus which suffer intensity loss from pole smearing and receive less intensity than normally desired. The deflecting structures of a beam deflecting element may be structured to generate an annular distribution of rays corresponding to a relatively narrow annulus. In this case, operation of an axicon system in extreme configuration of the axicon elements and associated pole smearing may be avoided completely or substantially reduced.

The disclosure also relates to an illumination system including a plurality of optical elements constructed and arranged to receive primary radiation emitted from a primary light source and to generate illumination radiation incident on a mask bearing a pattern; a number of the optical elements forming a pupil shaping unit configured to generate a defined spatial intensity distribution corresponding to a selected illumination mode in a pupil surface of the illumination system; wherein the pupil-shaping unit includes an optical beam deflecting element according to an aspect of the disclosure.

The disclosure also relates to a projection exposure apparatus including a light source generating primary radiation; an illumination system guiding the primary radiation along an illumination path to generate illumination radiation incident on a mask bearing a pattern; a projection objective projecting an image of the pattern onto a radiation-sensitive substrate with projection radiation guided along a projection path; wherein the illumination system is configured as mentioned above.

The disclosure also relates to a method of adjusting imaging properties of a projection exposure system having an illumination system and a projection objective, the method including:

arranging an optical beam deflecting element in a radiation path between a light source associated with the illumination system and a pupil plane of the illumination system to generate a predefined spatial intensity distribution in the pupil plane; and generating a relative displacement between a radiation beam incident on the beam deflecting element and the beam deflecting element, wherein the beam deflecting element is structured as described above or below.

This method of adjusting allows manipulating or changing the intensity distribution of radiation within a predefined illumination setting without modifying the position or operation mode of other components of the illumination system.

Utilizing beam deflecting elements as described herein makes it possible to reduce disparities between the imaging properties of various exposure systems. Specifically, the disclosure also relates to a method of matching imaging properties between a first projection exposure system and at least one second projection exposure system, wherein each exposure system includes an illumination system and a projection objective;

wherein each of the illumination systems includes an optical beam deflecting element arranged in a radiation path between a light source associated with the illumination system and a pupil plane of the illumination system to generate a predefined spatial intensity distribution in the pupil plane, wherein a first beam deflecting element in a first illumination system and a second beam deflecting element in a second illumination system have substantially identical structure and wherein a first radiation beam incident on the first beam deflecting element is guided onto a first region and a second radiation beam incident on the second beam deflecting element is guided onto a second region different from the first region such that disparities between the imaging properties of the first exposure system and the second exposure system are reduced when compared to a configuration when the same region is illuminated on the first beam deflecting element and the second beam deflecting element.

The beam deflecting elements in the illumination systems may be identical in sense that they are manufactured according to same design rules. Therefore, differences between the deflecting elements would only be within the tolerances given by the manufacturing process. The beam deflecting element in a first illumination system is operated in a first operation mode such that specific deflection regions or parts of deflecting regions are subject to the incident radiation beam, whereas the beam deflecting element in a second illumination system is operated in a slightly different second operation mode which provides a slightly different overall distribution of intensities over the ray angles of the predefined distribution of ray angles set in both the first and second exposure system. With other words: the beam deflecting elements in both exposure systems contribute to generate the same spatial intensity distribution according to the specification of the process, but slightly different intensity distributions within the same illumination settings. The differences between the intensity distributions may be adjusted to compensate at least partly differences between the optical performances of the respective exposure systems such that the performance differences do not show in the printed product. Therefore, a tool-to-tool matching for exposure systems may be obtained by working with the same type of beam deflecting element operated at slightly different operation modes within the respective illumination systems.

Differences in performance between nominally identical exposure systems may be caused, for example, by slight differences in the light source and/or in the masks which are used and/or in the materials used for the optical elements and/or in the arrangement of optical elements within in the optical system of the exposure system. Using beam deflecting elements as described herein makes it possible to reduce possible negative impact of these performance differences on the quality of the products produced. It is thereby possible to transfer or modify a lithographic process optimized for one particular exposure system to other exposure systems of the same type. Adjustment of the illumination of the mask utilizing a beam deflecting element of the present disclosure may be particularly useful in lithographic processes optimized for very high resolution.

One measure to describe the quality of a lithographic process is the variation of critical dimensions of a structure generated in a substrate. Variations in illumination dose can lead to variations in dimensions of imaged structures. In particular, as dose is decreased, structures tend to appear somewhat thinner than intended. Likewise, increased dose can lead to structures that image wider than intended. In either case, the variation in dimension (variation in critical dimension, or CD variation) can lead to defects in the finished microelectronic devices. A low level of CD variation is therefore generally desired in a lithographic process. Tool-to-tool matching using beam deflecting elements as described above or below may be used to decrease differences in CD variation between different projection exposure systems.

In this application, specific reference is made to the use of the projection exposure method and apparatus in the manufacture of integrated circuits. However, the method and apparatus may also be used in other applications, such as in the manufacture of integrated optical systems, guidance and detection patterns for magnetic domain memories, liquid-crystal display panels, thin-film magnetic heads etc.

The individual features may be implemented either alone or in combination as embodiments of the disclosure, or may be implemented in other fields of application. Further, they may represent advantageous embodiments that are protectable in their own right.

BRIEF DESCRIPTION OF THE DRAWINGS

In the figures:

FIG. 2 shows schematically various illumination modes;

FIG. 6 illustrates in 6A and 6B two operation modes of a beam deflecting element effective to influence the pole balance of a dipolar illumination setting;

DETAILED DESCRIPTION OF THE PREFERRED EMBODIMENTS

In the following description of preferred embodiments, similar or identical features shown in different figures are designated with the same reference identifications, where appropriate.

In optical lithography it is known to use off-axis illumination, which enables smaller features to be faithfully imaged. With this technique, a mask providing the patterned structure (pattern) is illuminated at oblique (non-perpendicular) angles such that process latitude is improved by increasing the depth of focus and/or such that contrast is improved.

Figure 1:
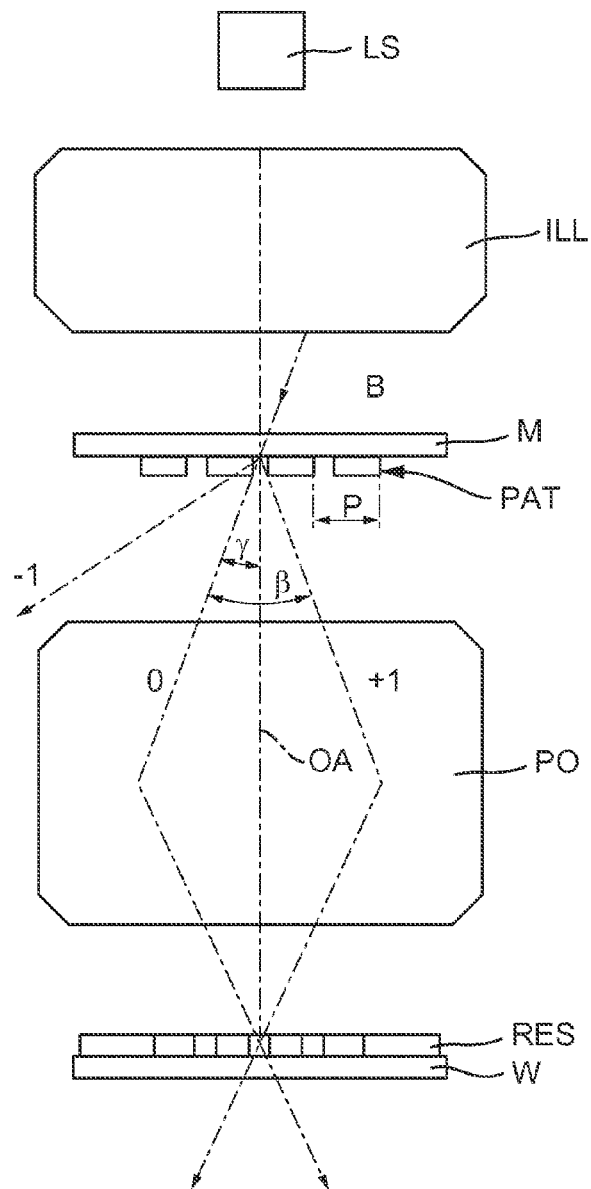
FIG. 1 illustrates schematically the principle of symmetric off-axis illumination in a projection exposure apparatus.

FIG. 1 illustrates the principle of off-axis illumination. An illumination system ILL of a projection exposure system receives primary radiation from a primary light source LS and forms illumination light in which a beam B is incident on a mask M carrying a pattern PAT. The beam is incident obliquely at an angle γ inclined to the optical axis OA, which is conventionally vertical. The incident beam B is diffracted by features of the pattern PAT on the mask M, which are to be imaged by a projection objective PO onto the wafer W coated by a layer of photoresist RES. The zeroth and two first-order-diffracted beams (0, ±1) are shown in FIG. 1. Improved performance can be achieved when, for example, at least part of the zeroth order and one of the first orders, which are coherent, are captured by the projection objective PO and used to form the image on the wafer W.

The smaller the pitch P (or periodicity length) of features of the pattern on the mask M, the larger the diffraction angle β will be according to $\beta=\lambda/P$, where λ is the nominal operating wavelength of radiation in beam B. If the size of the features decreases and/or their density increases too much, there will come a point at which the pupil of the projection objective PO can no longer capture more than one diffracted order. In practical systems there will be a range of opening angles γ which determines the partial coherence of the light source and thus is important to the figures of merit of the exposure process, such as exposure latitude, depth of focus and proximity effects.

The distribution of angles γ can be visualized by considering the intensity distribution of the effective radiation source (effective source) or equivalently the intensity distribution in the plane of a pupil of the projection objective. FIG. 2 shows representative examples.

FIG. 2A illustrates a simple on-axis illumination mode characterized by the parameter σ shown by an arrow in the figure. Values of σ (often referred to as coherence factor) are conventionally quoted as the ratio of the radius of the illumination intensity disc (hatched) to the radius of the pupil and therefore take a value between 0 and 1.

FIG. 2B shows an annular illumination mode in which the intensity distribution of the source is confined to an annulus to limit the range of angles of incidence of the off-axis illumination, considering that the spatial intensity distribution at the pupil plane is related to the angular distribution at the mask plane, which is a Fourier transform plane to the pupil plane. The annulus may be characterized by the values $\sigma_i$ and $\sigma_o$, which are the ratios of its inner and outer radii to the radius of the pupil.

FIG. 2C illustrates the intensity distribution of the quadrupole illumination mode, the use of which sometimes gives improved imaging results to the use of annular or coherent modes. Conventionally, in using such a quadrupole configuration, it is assumed that the patterned structure of the mask to be projected includes sub-patterns of orthogonal lines along x and y axes and the illumination is oriented such that each of the four poles is situated in a respective one of the four quadrants defined by these x and y axes and at their point of intersection.

In specific applications dipolar illumination modes are used. FIG. 2D shows an example of the dipolar illumination intensity distribution for a dipole mode. The two poles P1, P2 of this mode are located outside the optical axis OA of the imaging system. For illustrative purposes, the two poles illustrated in FIG. 2D are said to lie along the x axis and will be optimal for imaging lines extending parallel to the y axis, i.e. perpendicular to the pole orientation axis POA joining the two poles. Sometimes the x and y axis are referred to as horizontal and vertical, respectively, but these terms typically do not bear any relation to the orientation of the machine.

As illustrated in FIG. 2D the geometrical shape of the poles P1, P2 in conventional systems may correspond to an azimuthal section of an annulus. Because it is desirable that the first diffraction order passes completely through the aperture of the projection objective to obtain maximum contrast, limitations result for the radial width $\Delta\sigma=\sigma_o-\sigma_i$ of the poles and for the azimuthal width (width in circumferential direction) of the poles, which may be defined by the pole angle Θ. With dipole illumination, the effective light source is confined to two poles, in order to create the conditions for two-beam imaging with theoretical ideal contrast and depth of focus.

A spatial distribution of radiation intensity in the pupil plane may further be characterized by one or more energy distribution parameters sensitive to the distribution of radiation energy (or intensity) in the pupil plane. A number of examples are explained in connection with FIG. 3.

Figure 3A:
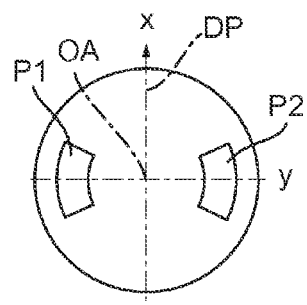
FIG. 3 illustrates schematically different definitions of energy distribution parameters, namely pole balance (FIG. 3A, 3B), ellipticity (FIG. 3C, 3D) and gradient (FIG. 3E, 3F)
Figure 3B:
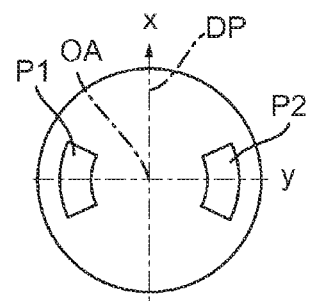

FIG. 3A, 3B relate to definitions of the parameter "pole balance (PB)", which is a quantitative measure of how radiation energy is distributed between two sides of a dividing plane DP which subdivides the pupil plane centrally. In FIG. 3A, the dividing plane DP runs along the x-direction, while two poles, P1, P2 of a dipolar illumination setting are oriented in the perpendicular y-direction. The pole balance may be defined as the ratio between the integrated intensities in the two half pupils. In the case of dipole illumination, the corresponding pole balance parameter PB may also be defined as the ratio $I_{MAX}/I_{MIN}$ between the intensity of the pole having the maximum intensity and intensity of the pole having the minimum intensity. Equal intensities in both poles would thereby lead to PB=1, and uneven intensity distribution between the poles would lead to pole balance values differing from 1. In FIG. 3B, the dividing plane DP runs along the y-direction such that the corresponding pole balance parameter PB relates to the ratio of intensities between the upper half and the lower half of the pupil. This parameter might be largely insensitive to differences in intensities of two poles in y-direction if the energy within the poles is distributed evenly over the upper and lower half of the pupil. However, if there is a disparity in x-direction this would show in this pole balance parameter.

Figure 3C:
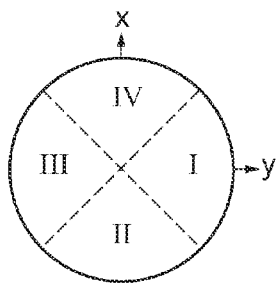
Figure 3D:
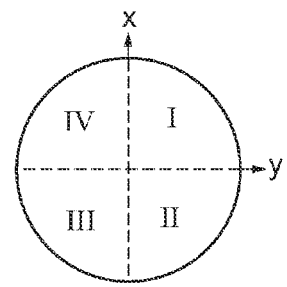

FIGS. 3C, 3D illustrate definitions of the parameter "ellipticity (EL)". In general, the ellipticity is an energy distribution parameter specifying how radiation energy is distributed along regions centered about two or more axes intersecting at the pupil center. In most cases, the ellipticity refers to an energy distribution about two mutually orthogonal directions in the pupil plane. FIG. 3C illustrates the horizontal/vertical ellipticity $EL_{HV}$. The pupil is subdivided into four 90° quadrants I to IV by dividing planes running at 45° between the x- and y-directions. The first and third quadrants I and III are centered about the y-direction, whereas the second and third quadrants II and IV are centered about the x-direction. To determine the ellipticity, the energy contained in each of the quadrants is integrated separately. The sum of energies in the first and third quadrants centered about the y-direction is then divided by the sum of energies in the second and fourth quadrants centered about the y-direction according to $EL_{HV}= (I_I+I_{III})/(I_{II}+I_{IV})$. FIG. 3D illustrates an alternative definition of the ellipticity $EL_{ST}$ in quadrants arranged at 45° relative to the quadrants of FIG. 3C. Here, the quadrants I and III are centered about a middle diagonal between the x- and y-directions etc., and the ellipticity value is calculated analogously as described in connection with FIG. 3C. If the ellipticity of a dipole illumination with y poles is to be determined, it is evident that the horizontal/vertical ellipticity of FIG. 3C is insensitive to an inbalance in the intensities of the two poles as long as no intensity is guided in the second or fourth quadrants. However, the ellipticity $EL_{ST}$ may show some changes if the energy within each of the pole is not distributed evenly with respect to the y axis. In general, the ellipticity is most frequently used to quantify energy distributions in annular, hexagonal or conventional illumination settings.

Figure 3E:
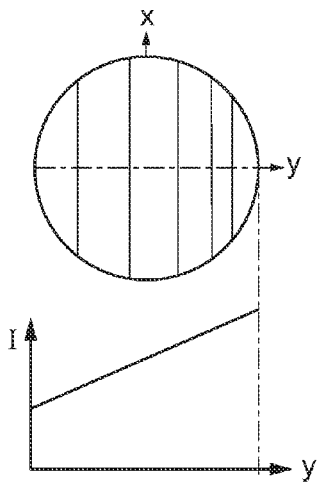
Figure 3F:
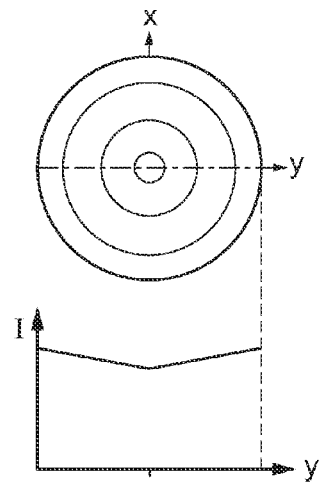

FIG. 3E, 3F illustrate situations were it may be useful to determine the energy distribution parameter "gradient (GRAD)" to describe an energy distribution of an illumination setting. Basically, the gradient describes a two-dimensional energy disparity which may be described as a variation of intensity along one predefined direction in the pupil plane. In the example of FIG. 3E, the intensity increases continuously from negative y-values towards positive y-values and the gradient may be described by the slope of the function E(y). In FIG. 3F the function E(y) has a minimum at the center of the pupil indicating that the energy increases in radial direction from the center of the pupil towards the edges.

Figure 4:
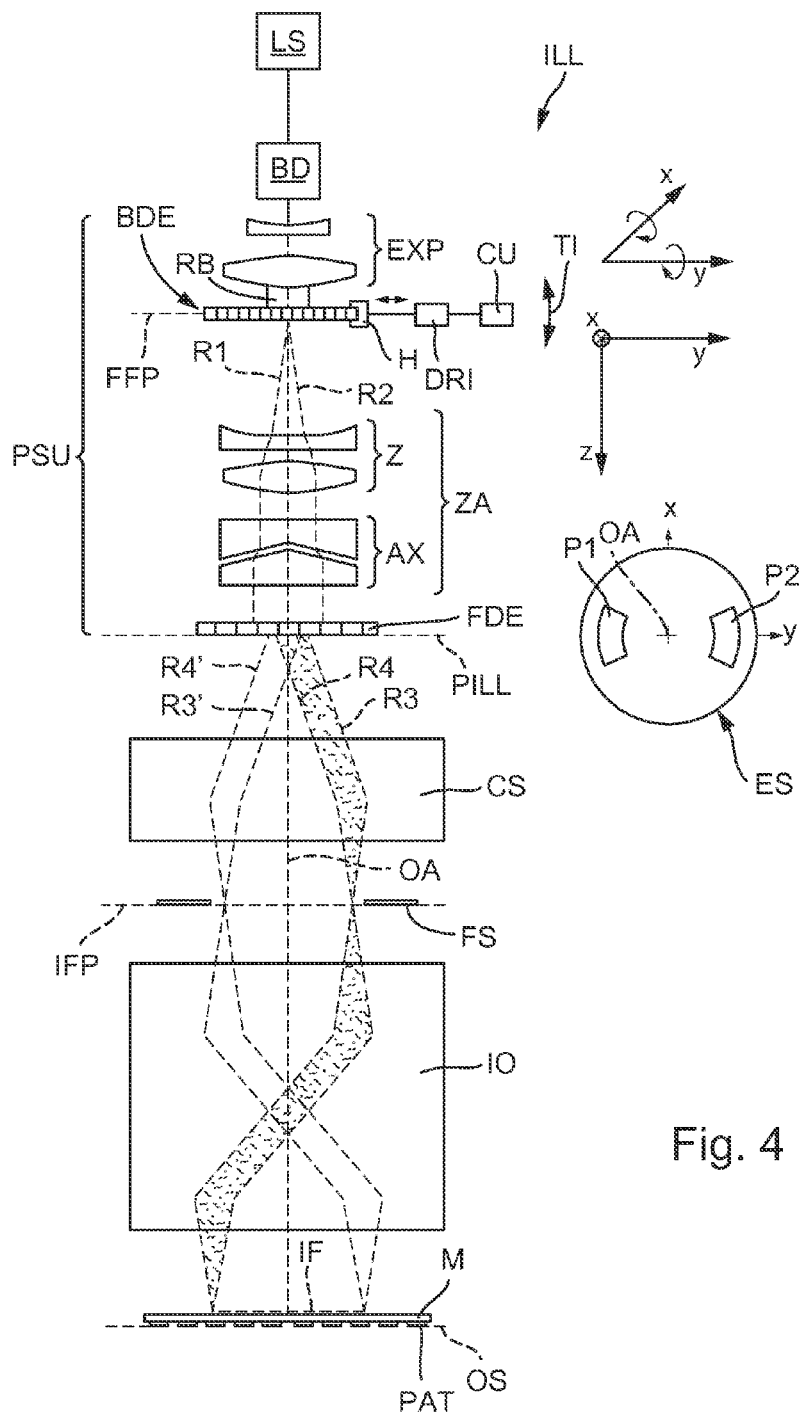
FIG. 4 illustrates schematically an embodiment of an illumination system configured for dipole illumination mode.

FIG. 4 illustrates schematically an embodiment of an illumination system ILL for a projection exposure system configured for dipole illumination mode. Primary radiation provided by a primary light source LS is transformed by the illumination system ILL to provide illumination radiation incident in an illuminated field IF on a mask M bearing a pattern PAT. The radiation is diffracted by pattern PAT and forms projection radiation propagating through a projection objective (not shown) which images the pattern of the mask onto the substrate, such as wafer coated with a resist layer.

The illumination system ILL includes a pupil shaping unit PSU to create an effective source ES formed by a predefined spatial intensity distribution at a pupil plane $P_{ILL}$ of the illumination system, where the predefined intensity distribution corresponds to a dipole illumination setting characterized by two poles P1 and P2. The pupil plane $P_{ILL}$, where the effective source ES is formed, is a Fourier transform surface with respect to the object surface OS of the projection objective, where the mask M is situated. Therefore, the spatial distribution of light intensity of the effective source ES determines an angular distribution of illumination radiation incident on the mask M. A condenser system CS is provided to perform the Fourier transformation.

The pupil surface of the projection objective is optically conjugated to the pupil surface $P_{ILL}$ of the illumination system. Therefore, in the absence of a mask, a spatial intensity distribution equivalent to the intensity distribution at the effective source ES may be formed in the pupil surface of the projection objective. Where a mask bearing a pattern is inserted between the illumination system and the projection objective, the intensity distribution in the pupil plane of the projection objective also contains diffraction information corresponding to the properties of the mask pattern PAT.

The illustration of FIG. 4 is considerably simplified and not to scale. This particularly implies that different optical units are represented by few optical elements only. In reality, these units may include significantly more lenses and other optical elements. The illumination system is now described in more detail.

An excimer laser emitting primary radiation at an operating wavelength of about 193 nm serves as a primary radiation source LS. Other wavelengths, for example 248 nm or 157 nm, are also contemplated. The radiation emitted by the excimer laser is guided by a beam delivery system BD to the illumination system ILL and enters a beam expansion unit EXP, in which the radiation bundle is expanded without altering the geometrical optical flux. The beam expansion unit may include several lenses as shown, or may be realized as a mirror arrangement, for example. The radiation emerges from the beam expansion unit EXP as a substantially collimated radiation beam RB having a rectangular cross section. The size of the cross section may be in the order between 15 mm and 25 mm, for example.

After passing through the beam expansion unit EXP, the rays of the radiation beam impinge on a transparent optical beam deflecting element BDE formed by a diffractive optical element (DOE). The diffractive optical element BDE includes a two-dimensional raster arrangement of small cells each having a predefined diffraction grating structure acting as a deflecting structure to deflect radiation with little energy loss into desired propagation directions. The energy loss may be in the order of less than 15%, for example between 5% and 15%. The beam deflecting element includes, in the embodiment shown, deflecting structures formed by diffraction gratings that deflect each incident ray such that a divergence is introduced. This means that at each location on the beam deflecting element, radiation is diffracted within a certain range of angles. In FIG. 4 this is schematically represented for an axial ray that is split into two diverging rays R1, R2. The diffractive optical element BDE thus modifies the angular distribution of the incident radiation and influences the far field intensity distribution.

The diffractive beam deflecting element BDE is received in an exchange holder H so that it can easily be replaced by another beam deflecting element producing different angular distributions. A drive system DRI associated with the holder H is configured to controllably move the holder and the beam deflecting element BDE received therein in a plane (x-y-plane) perpendicular to the optical axis OA of the illumination system in response to drive signals received from a central control unit CU of a projection exposure apparatus incorporating the illumination system. Activating the drive system thereby allows that different regions of the beam deflecting element BDE can shifted continuously into the radiation beam path. The movement may be in the x direction, or in the y direction, or in any traverse direction depending on the combined actuation of x-drive and y-drive.

The movement may include a rotation, for example about an axis in the x/y plane to tilt the beam deflecting element. The tilting movement of the beam deflecting element BDE is indicated by a curved double-arrow TI in FIG. 4. Tilting angles may be in the order of one or more degrees, e.g between about 1° and about 5°. If the beam deflecting element is tilted, the angles of incidence of incident radiation and the illuminated area may be slightly changed. A tilting may contribute to varying the energy distribution in the emitted radiation, mainly because the effective structure of an illuminated deflecting region may be changed and/or because the spatial shape and position of a deflecting region acting on the incident radiation may be slightly changed by tilting the beam deflecting element. Further, it has been found that a moderate tilt of a diffractive beam deflecting element away from exact normal incidence can help to reduce undesired intensity in the $0^{th}$ diffraction order. Such residual intensity in the $0^{th}$ order may result, for example, from inaccuracies in etching depth during manufacturing of stepped surfaces in phase-step diffractive optical elements. A tilting may therefore improve the intensity distribution generated by the beam deflecting element.

The diffractive optical element BDE is positioned in a front focal plane FFP of a zoom lens group Z which collimates the diverging rays emerging from the diffractive beam deflecting element. By adjusting the zoom lens group Z it is thus possible to vary the diameter of the radiation bundle. The at least substantially collimated ray bundle exiting the zoom lens group then enters a pair AX of axicon elements having opposing conical faces. If both axicon elements are in contact, the axicon pair AX has the effect of a plate having parallel plane surfaces. If both axicon elements are moved apart, the spacing between the axicon elements results in a shift of radiation energy radially outward. A ray bundle having a cross section of a circular disk will thus be transformed into a ray bundle having the cross section of a ring (or annulus). Since axicon elements are known as such in the art, these will not be explained here in further detail.

Reference identification $P_{ILL}$ denotes a pupil plane of the illumination system ILL. Immediately in front of the pupil plane $P_{ILL}$ an optical raster element FDE is arranged, which may include a plurality of micro-lens arrays. The optical raster element FDE produces a plurality of secondary light sources in the illumination system pupil plane $P_{ILL}$. The secondary light sources may produce light with different divergences along the x and y directions. For example, if a slit shapes illuminated field is desired on the mask, then the exit side numerical aperture of the optical raster element FDE may be in the range from 0.28 to 0.35 in the x-direction and in the range from 0.07 to 0.09 in the y-direction. The divergence introduced by the optical raster element FDE is schematically represented in FIG. 4 by divergent rays R3, R3', R4, R4' emerging from two different secondary light sources.

The diverging rays emerging from the optical raster element FDE enter a condenser system CS. The front focal plane of the condenser system coincides with the system pupil plane $P_{ILL}$, and the back focal plane will be referred to in the following as an intermediate field plane IFP. Thus a diverging light bundle emerging from a particular secondary light source in the system pupil plane leaves the condenser system CS as parallel ray bundles and completely illuminates the intermediate field plane IFP. On the other hand, all rays emerging from the secondary light sources under the same angle will converge to a single point in the intermediate field plane IFP (see dotted area in FIG. 4).

A field stop FS is positioned in or in close proximity to the intermediate field plane IFP. An imaging objective IO optically conjugates the intermediate field plane IFP to an image plane in which the mask M is positioned during the exposure operation. This image plane is also referred to as mask plane, and corresponds to the object plane OS of the subsequent projection objective (not shown). The imaging objective IO thus images the field stop FS arranged in the intermediate field plane IFP onto the mask M and ensures sharp edges of the illuminated field IF at least for the short lateral sides extending along the y-direction.

As indicated by the inset FIG. 4A showing an axial view of the pupil surface of the illumination system (effective source ES) the illumination system is set up to provide dipole illumination having two intensity poles P1, P2 outside the optical axis OA disposed symmetrically to the x-direction such that intensity is only present at the outer edge of the pupil in the y-direction (compare also FIG. 2D). This spatial intensity distribution is effected by combined action of the diffractive beam deflecting element BDE and the zoom-axicon system ZA, were the axicon elements are separated such that a spacing is provided between the complementary conical surfaces. While the diffractive optical element BDE deflects rays into two wedge shaped angular zones around the y-direction, the zoom-axicon system redirects rays outwardly in radial direction such that no intensity is present on the optical axis. In this setup, the distribution of ray angles generated by the diffractive optical element defines the azimuthal width of the poles (pole angle $\Theta$). The radial position and radial width $\Delta\sigma$ of the poles is adjusted by appropriate separation of the zoom-axicon system.

Figure 5A:
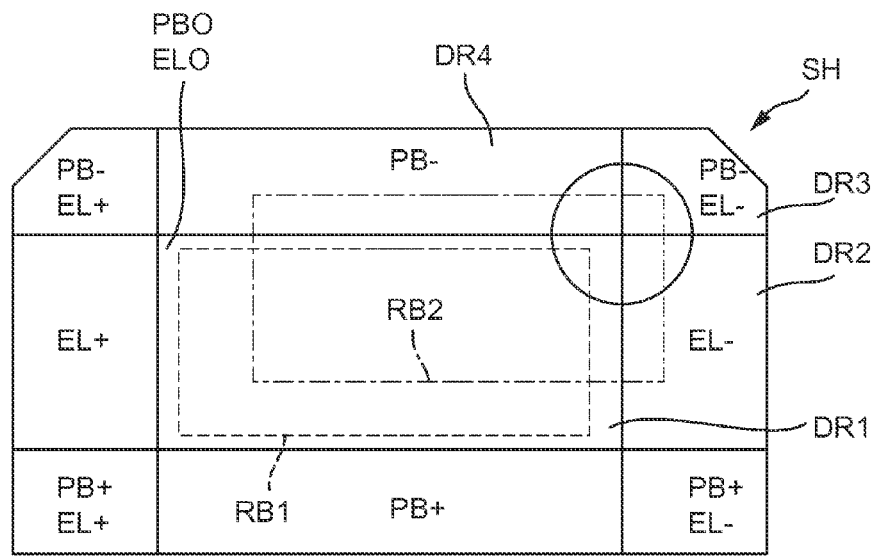
FIG. 5 shows schematically a plan view of a first embodiment of a beam deflecting element in 5A and an enlarged detail of the beam deflecting element in 5B.
Figure 5B:
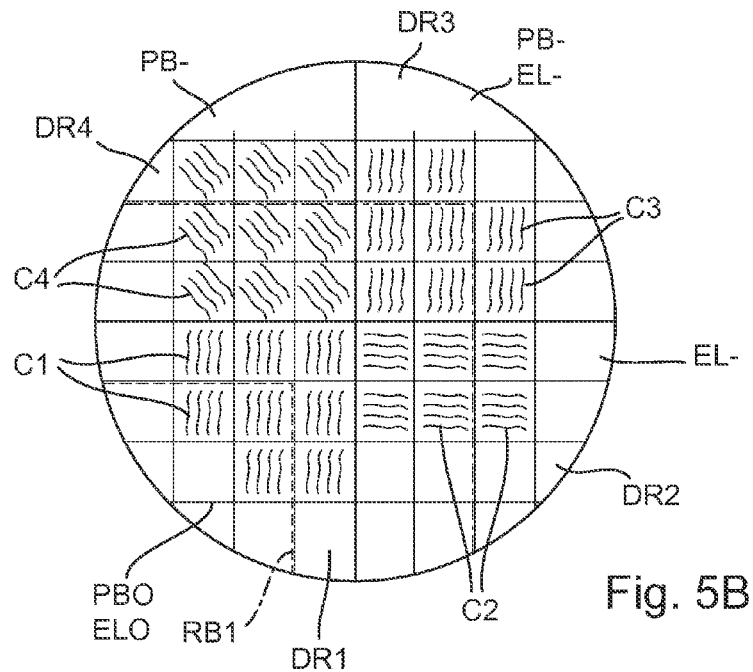

A first embodiment of an optical beam deflecting element BDE employed to generate the dipole setting is now described in more detail with reference to FIG. 5. FIG. 5A shows a plan view of the beam deflecting element BDE in a direction parallel to the optical axis of the illumination system, i.e. roughly parallel to the direction of rays of the incident radiation beam RB. FIG. 5B shows an enlarged detail indicated by a circle in FIG. 5A. The beam deflecting element basically includes a plane parallel plate made from optical quality material, such as fused silica ($SiO_2$) or calcium fluoride ($CaF_2$) transparent to the laser radiation at the operating wavelength. The beam deflecting element BDE is a diffractive optical element (DOE) effecting a redirection of incident radiation by diffraction rather than refraction. The diffractive optical element BDE includes a two-dimensional raster arrangement of small rectangular cells C1, C2, C3, . . . , each having a predefined diffraction grating structure acting as a deflecting structure to deflect radiation essentially without energy loss into desired propagation directions. The rectangular cells are directly adjacent to each other and fill the optically used cross-section of the beam deflecting element without gaps. The diffractive cells are distributed to form cell groups filling predefined regions of the diffractive optical element. The diffractive structures are generated by backward calculation based on a desired angular distribution. Such elements also denoted a computer generated hologram (CGH).

A rectangular first deflecting region DR1 formed around the center of the diffractive optical element includes an arrangement of identical first cells C1, each having the same diffractive structure, which is thereby multiply repeated in the cells of the first deflecting region. The size of the first deflecting region is somewhat larger than the cross-sectional shape of the incident radiation beam in both x and y-direction such that the incident radiation illuminates only first cells C1 if the beam deflecting element is arranged in a first operating position centered about the incident radiation beam. In FIG. 5A, the footprint RB1 of the radiation beam in the first operating position is indicated with dashed lines.

Each of the first cells is structured to create the same distribution of ray angles in the diffracted rays. The ray angles transform to ray positions in the pupil plane of the illumination system such that the geometric distribution of ray angles defines the geometric shape of illuminated zones (poles) in the pupil plane. Further, the intensity (energy) of the diffracted radiation is distributed over the various ray directions according to a first intensity distribution, where the first intensity distribution describes how the overall intensity incident on a first cell is distributed over the different diffraction angles or propagation directions created by the first cells. The first intensity distribution may be defined such that the intensities within the two poles P1, P2 essentially correspond to a top-hat-function with a uniform intensity for all positions within a pole and substantially no intensity outside the poles. Further, the level of intensity is intended to be the same in both poles.

Immediately adjacent to the first deflecting region DR1 in the y-direction there is a rectangular second deflecting region DR2, which is composed of second cells C2 each having second deflecting structures, where all second deflecting structures are essentially the same. A set of illuminated second cells generates a second bundle of second rays, where each of the second rays has a propagation direction belonging to the geometrical distribution of ray angles also generated by the first cells of the first deflecting region. Therefore, if second cells are illuminated, diffracted radiation is guided towards the same illuminated regions in the first and second poles. However, the second rays have second intensities according to a second intensity distribution which differs from the first intensity distribution. With other words: although the first cells C1 and the second cells C2 generate substantially the same ray angles (propagation directions) in the diffracted rays, the distribution of radiation energy over the created ray angles is different between the first cells and the second cells.

Further, the upper right corner of the beam deflecting element includes a third deflecting region DR3 formed by a group of third deflecting structures organized in third cells C3. Each of the third deflecting structures within the third cells is the same and creates the same distribution of ray angles as the first cells and the second cells. However, the distribution of intensity over the rays of the created distribution of ray angles is different from the first and second intensity distributions.

Further, the optical beam deflecting element includes a fourth deflecting region DR4 immediately adjacent to the first deflecting region DR1 and laterally offset thereto in the x-direction. The fourth deflecting region includes fourth deflecting structures in fourth cells C4, where each of the fourth cells generates a fourth bundle of fourth rays where all the fourth rays have propagation directions (or ray angles) within the distribution of ray angles also created by the first, second and third deflecting region. However, the distribution of intensities over these fourth rays is different from the intensity distributions of the first, second, third deflecting region. Further deflecting regions are arranged on other sides of the first deflecting region, as shown schematically in FIG. 5A.

It is to be understood that all deflecting structures within the different cells of the different deflecting regions DR1, DR2, DR3, DR4 etc. produce substantially the same geometric distribution of ray angles, which transforms to the particular dipolar spatial intensity distribution in the pupil plane, in a Fourier transform relationship to the position of the beam deflecting element. However, the first cells C1 produce a different intensity distribution for the diffracted rays than the second cells or the third cells or the fourth cells. Therefore, the spatial distribution of radiation intensity within the illuminated zones (poles) in the pupil plane can be varied by choosing appropriate numbers and types of cells which are illuminated by the incident radiation beam. For example, the first cells C1 in a first deflecting region may be structured such that there is an even distribution of intensities in the two poles of a dipole illumination. The second cells C2 in the second deflecting structure may be structured such that an ellipticity EL of the intensity distribution decreases relative to the ellipticity generated by the first deflecting region. This situation is indicated by "EL−". The third cells C3 in the third deflecting region may be structured such that they create the same ellipticity as the second cells C2 (EL−), but that the overall energy is shifted between the poles such that the pole balance PB is smaller than in the intensity distribution generated by the first or second cells (indicated by PB−). In contrast, fourth cells C4 in the fourth deflecting region DR4 are structured to generate the same spatial intensity distribution and ellipticity value than the first cells in the first deflecting region DR1, but a different distribution of energy over the poles to decrease pole balance (PB−).

A skilled person understands that such optical beam deflecting element is effective and can be used as an energy distribution manipulator in an illumination system to continuously vary the energy distribution within a given spatial intensity distribution in the pupil plane, i.e. substantially without changing the shape and size and position of illuminated areas in the pupil plane. This may be understood from the schematic drawings in FIG. 5A. In a first operating position the incident radiation beam is incident on the first deflecting region DR1 only (indicated by footprint RB1) thereby creating an angular distribution of rays having the ray angles generated by the first cells C1 and the first intensity distribution corresponding to the first cells only. If it is found that the energy distribution obtained in this neutral position of the beam deflecting element produces insufficient results in the printed structures, the energy distribution over the same poles can be changed by laterally shifting the beam deflecting element relative to the incident radiation beam such that deflecting structures generating another intensity distribution contribute to the formation of the intensity distribution in the pupil plane. In the example, the optical beam deflecting element is shifted along a direction SH diagonally to the x- and y-direction in the x-y plane such that the incident radiation beam illuminates not only first cells in the first deflecting region DR1, but also second cells, third cells and fourth cells in the second, third and fourth deflecting region. The footprint RB2 of the radiation beam in this second operating position of the beam deflecting element is indicated with dash-dotted line. Due to the fact that second, third an fourth cells now contribute to the overall intensity distribution in the pupil plane to an extent roughly proportional to the relative number of single cells illuminated by the incident radiation beam, the energy distribution is now modified to yield decreased ellipticity (EL−) and decreased pole balance (PB−). The relative contributions of first, second, third and fourth cells may be changed continuously depending on the amount of movement of the beam deflecting element relative to the incident radiation beam (and direction).

It is apparent from this exemplary description that the beam deflecting element of FIG. 5 may be operated to vary two different energy distribution parameters, namely pole balance PB and ellipticity EL, independent from each other, or in combination, depending on the direction at amount of displacement relative to the incident radiation beam. Specifically, movement only in the x-direction may be used to either decrease or increase pole balance (PB). Movement only in the y-direction can be used to either decrease or increase ellipticity (EL). Movements in arbitrary directions between the x and y-directions can change both pole balance and ellipticity by amounts continuously adjustable by selecting appropriate shifting direction and shifting length.

FIG. 6 shows schematically how the pole balance in a dipole illumination setting with poles along the y-direction may be manipulated by shifting a diffractive beam deflecting element relative to an incident radiation beam RB. In the first configuration shown in FIG. 6A the beam deflecting element BDE is arranged in a neutral position where the incident radiation beam is incident on cells in a first deflecting region DR1 only. The diffractive deflecting structures of the cells are structured to generate dipole illumination in the pupil $P_{ILL}$ of the illumination system. The top partial figure shows how the intensity I is distributed between two poles P1, P2. In the example, the first pole P1 on the left hand side receives more energy than the second pole P2 on the right hand side. The disparity of intensity is indicated by a pole balance PB≠1. The disparity in energy distribution over the poles may show in insufficient image quality of the exposure process. The image quality may be improved by modifying the energy distribution over the two poles. This is shown schematically in FIG. 6B. In this second configuration the beam deflecting element BDE is shifted by the associated drive system DRI such that the incident radiation beam RB illuminates both first cells in the first deflecting region DR1 and second cells in a second deflecting region DR2 laterally offset to the first deflecting region DR1. This region includes cells with deflecting structures which guide more intensity to the pole on the right side and less intensity to the left hand side of the pupil, thereby shifting a certain amount of radiation intensity from the left to the right hand side. The beam deflecting element may be shifted controllably to a position where both poles receive substantially the same intensity, which situation is indicated by the pole balance PB=1.

Figure 7A:
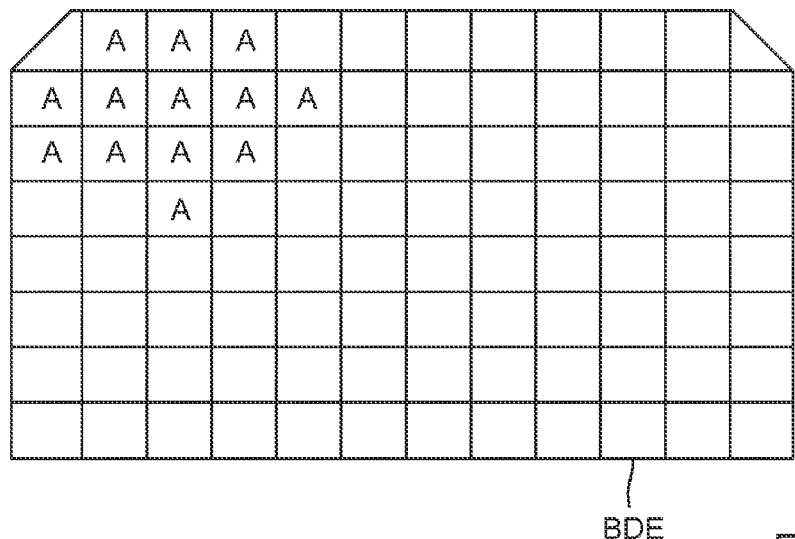
FIG. 7 shows in 7A a plan view of a second embodiment of a beam deflecting element and in 7B an enlarged detail of the second embodiment.
Figure 7B:
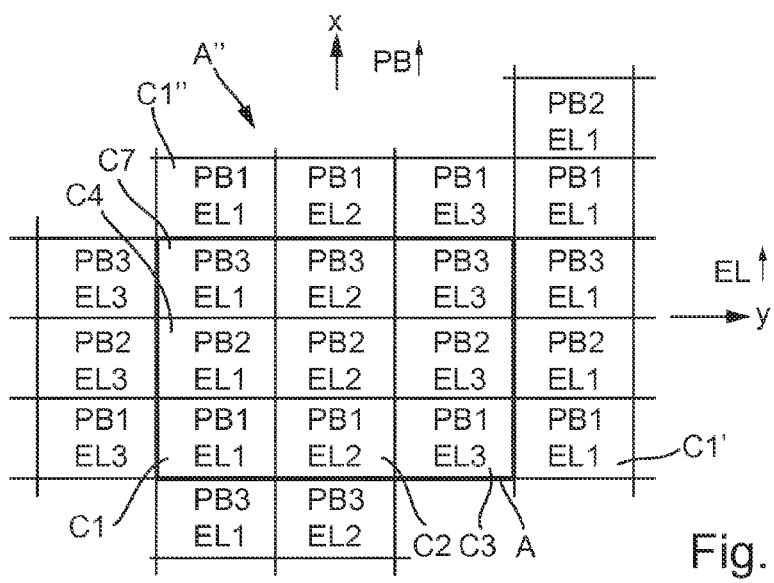

A second embodiment of a diffractive beam deflecting element BDE is now discussed in connection with FIGS. 7 and 8. The beam deflecting element may be used to effect very fast variations in the spatial distribution of radiation generated by the beam deflecting element with a small movement of the position of the beam deflecting element relative to an incident radiation beam. As shown in FIG. 7A, the beam deflecting element includes a two-dimensional arrangement of rectangular super cells A arranged in an orthogonal array filling the entire optically useful area without gaps. As shown in FIG. 7B, each super cell A is subdivided into a predefined number of cells, such as nine cells C1 to C9 arranged in three columns and three rows. Each cell C1 to C9 has a diffractive structure generating an intensity distribution with a predefined distribution of ray angles according to a specified illumination setting, such as a polar setting or a quadrupole setting. The distribution of ray angles is substantially the same for all cells within a super cell A such that the beam deflecting element produces the corresponding shape of the spatial intensity distribution irrespective of where an incident radiation beam impinges on the beam deflecting element.

However, the deflecting structures of the cells differ with regard to the energy distribution within the predefined setting. To this end, the beam deflecting element contains periodically repeating deflecting structures with periodicities according to the edge length of the super cells A. In one periodicity direction parallel to the y-direction the ellipticity EL increases whereas the pole balance is constant. In the orthogonal x-direction the ellipticity is constant and the pole balance varies. For example, first cell C1 at the lower left corner of super cell A creates a first ellipticity EL1 and a first pole balance PB1. In the neighbouring cells C2 and C3 in the y-direction the pole balance remains the same, whereas the ellipticity is changed to a second ellipticity EL2 in cell C2 and a third ellipticity EL3 in cell C3. In the first cell C1' of the neighbouring super cell A' one y-period offset relative to first cell C1 of super cell A the energy distribution parameters PB1 and EL1 are the same as in first cell C1, showing the periodicity in y-direction. In a similar manner, the ellipticity stays constant, and the pole balance varies in the x-direction. Specifically, fourth cell C4 generates a first ellipticity EL1 and a second pole balance PB2, and seventh cell C7 generates a first ellipticity EL1 and a third pole balance PB3. The following cell C1" in the neighbouring super cell A" is identical to the structure of the first cell C1, showing the periodicity in x-direction.

All cells providing the same intensity distributions, such as cells C1, C1' and C1" etc. may be considered as first deflecting regions arranged at spaced apart positions in a first periodic raster arrangement and neighbouring second cells may be considered as second deflecting regions arranged at spaced apart positions laterally offset to the first deflecting regions in a second periodic raster arrangement. The embodiment also includes third deflecting regions arranged at spaced apart positions in a third periodic raster arrangement.

In each raster arrangement, the cells producing the same intensity distributions can be addressed simultaneously if an incident radiation beam is separated into partial beams forming illumination spots on the respective cells of a raster arrangement. FIG. 8 shows some components of a pupil shaping unit which is configured to address such beam deflecting element BDE. In this simplified illustration, first deflecting regions DR1 are shown with hatching, whereas second deflecting regions DR2 arranged in spaces between the first deflecting regions are plain. The beam deflecting element BDE is received in a holding structure H associated with a drive system DRI configured to shift the beam deflecting element in a plane perpendicular to the optical axis OA.

The radiation beam RB provided by the beam delivery is expanded in diameter by expansion unit EXP. A beam separator SEP is arranged between the expansion unit and the beam deflecting element BDE. The beam separator includes a microlens array including a raster arrangement of lenses or lens systems forming a plurality of optical channels which geometrically split the incident radiation beam into a number of partial beams PB corresponding to the number of illuminated channels of the beam separator SEP. A further lens array may be placed between the beam separator and the beam deflecting element to provide roughly colinar rays in all partial beams such that the rays are incident essentially parallel to the optical axis OA onto the beam deflecting element. In the region of the beam deflecting element, the partial beams form illumination spots which are matched in size and position to single cells of the beam deflecting element corresponding to a raster arrangement of deflecting regions to be illuminated.

Figure 8:
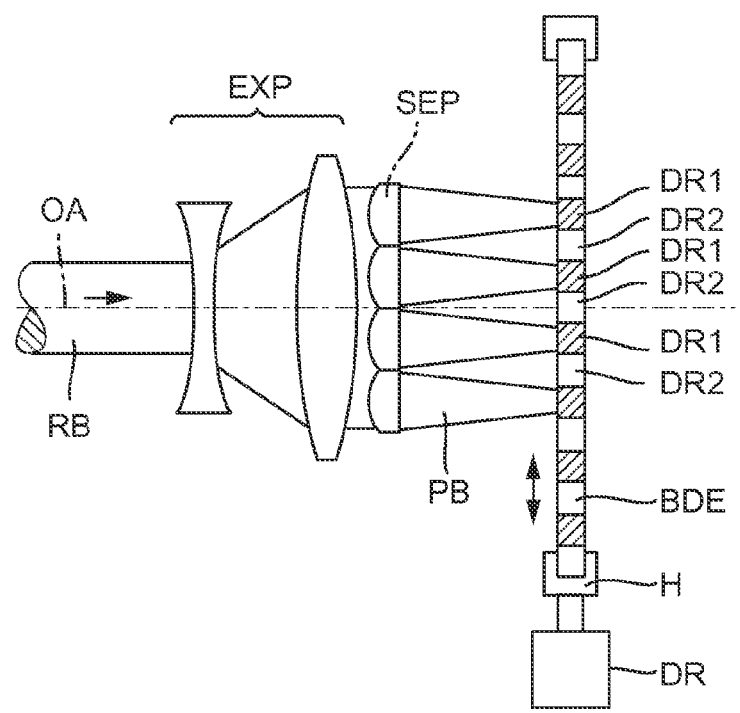
FIG. 8 shows schematically a portion of a pupil shaping unit of an illumination system including a beam deflecting element having raster arrangements of different deflecting regions, and a beam separator upstream of the beam deflecting element to generate partial beams directed at selected deflecting regions.

In the example of FIG. 8, all partial beams illuminate first deflecting regions DR1 in a beam deflecting element having only two types of beam deflecting regions. In the embodiment of FIG. 7, the illumination may be subdivided such that only first cells C1, C1', C1" are illuminated by the partial beams when the beam deflecting element is positioned appropriately relative to the regular pattern of illumination spots provided by the beam separator.

In an alternative embodiment not shown, the beam separator includes an opaque mask having a plurality of transparent apertures to provide the partial beams directed at the beam deflecting element. Relatively complex an expensive optical element, such as one or more microlens arrays, may be dispensed with; however, a perforated mask normally causes considerable radiation loss, which may be undesirable in many applications.

In embodiments having two or more sets of periodic raster arrangements of deflecting regions in an interlaced (nested) configuration, a large number of single deflecting regions can be illuminated simultaneously to produce an exiting beam (consisting of a large number of partial beams) each having a desired distribution of geometric ray angles and a desired intensity distribution. At the same time, a quick change of the intensity distribution may be effected by only a small movement of the beam deflecting element relative to the incident beam (or vice versa) such that other deflecting regions are illuminated. As only small relative displacements are desirably completely change the type of deflecting regions illuminated by an incident radiation beam, this configuration allows very fast changes of intensity distribution within a given illumination setting.

The concept of utilizing two or more interleaved periodic raster arrangements of deflecting regions having different effects, as described in connection with FIGS. 7 and 8, may also be utilized to switch between entirely different illuminations settings, should that be desired. For example, first deflecting regions of FIG. 8 could be structured to generate a specific dipole illumination, whereas second deflecting regions DR2 could be structured to generate quadrupole illumination. Therefore, a fast change between dipole illumination and quadrupole illumination could be achieved by a small movement of the beam deflecting element relative to the regular array of illumination spots generated by the partial beams incident on the beam deflecting element.

Figure 9:
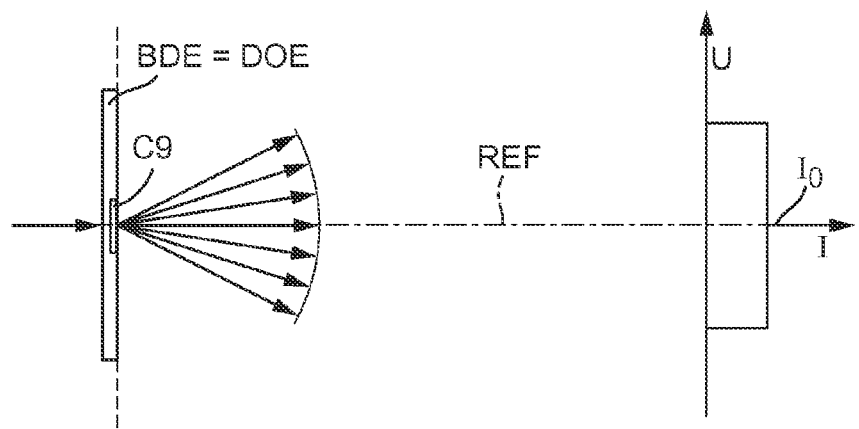
FIG. 9 shows the optical effect of a single cell on radiation contained a radiation beam RB incident on the cell.

Further properties of optical beam deflecting elements and their use in different embodiments are now explained in connection with FIG. 9 ff. In the embodiments, the beam deflecting element BDE is in the form of a diffractive optical element (DOE) effecting a redirection of incident radiation by diffraction rather than refraction. Therefore, the terms "beam deflecting element (BDE)" and "diffractive optical element (DOE)" may be used interchangeably in the context of the following description.

In general, a diffractive optical element may include a two-dimensional raster arrangement of small cells each having a predefined diffraction grating structure effective as a deflecting structure to deflect radiation of a radiation beam RB incident on the deflecting structure essentially without energy loss into desired propagation directions defined by the specific structure of the diffraction grating structure in the cells. There may be hundreds or thousands of cells in a DOE. FIG. 9 shows the optical effect of a single cell C on radiation contained in a radiation beam RB incident on the cell parallel to a reference direction REF which may be parallel to an optical axis of an optical system incorporating the beam deflecting element. In the embodiment of FIG. 9 an illuminated portion of the single cell C9 generates a pencil of rays (also referred to as ray bundle or partial ray bundle) shaped as a radiation cone where the radiation energy or intensity is the same in all propagation directions which receive radiation energy. FIG. 9 shows arrows representing a number of selected propagation directions, where the lengths of the arrows are proportional to the radiation intensity propagating in the corresponding solid angle segment represented by the arrows. The propagation direction may be defined by direction parameter u (u, v), which defines an angle in space relative to a reference direction. The diagram on the right-hand side of FIG. 9 indicates that the intensity I is a non-zero constant $I_0$ for all propagation directions u covered by the pencil of rays, and the intensity is zero for all other directions.

Figure 10:
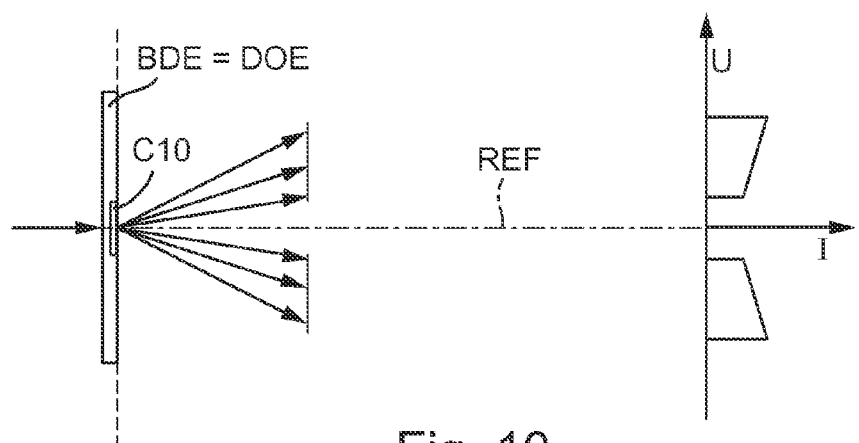
FIG. 10 shows the optical effect of a different type of grating structure in a cell formed in a diffractive beam deflecting element.

FIG. 10 shows the optical effect of a different type of grating structure in a cell C10 formed in a diffractive beam deflecting element. In this embodiment, the diffraction grating is structured such that the cell C10 creates a pencil of rays where the intensities in the different propagation directions vary over the propagation directions and where certain propagation directions between the outermost ray directions have no intensity at all. Specifically, radiation of the radiation beam RB is diffracted into two spatially separated pencils of rays, wherein in each pencil of rays the intensity in propagation directions having larger angles with respect to the reference direction is larger and decreases about linearly towards propagation directions closer to the reference direction. FIGS. 9 and 10 indicate that the spatial intensity distribution of radiation effected by deflecting structures may be selected in a targeted fashion by appropriate design of the deflecting structures.

Figure 11:
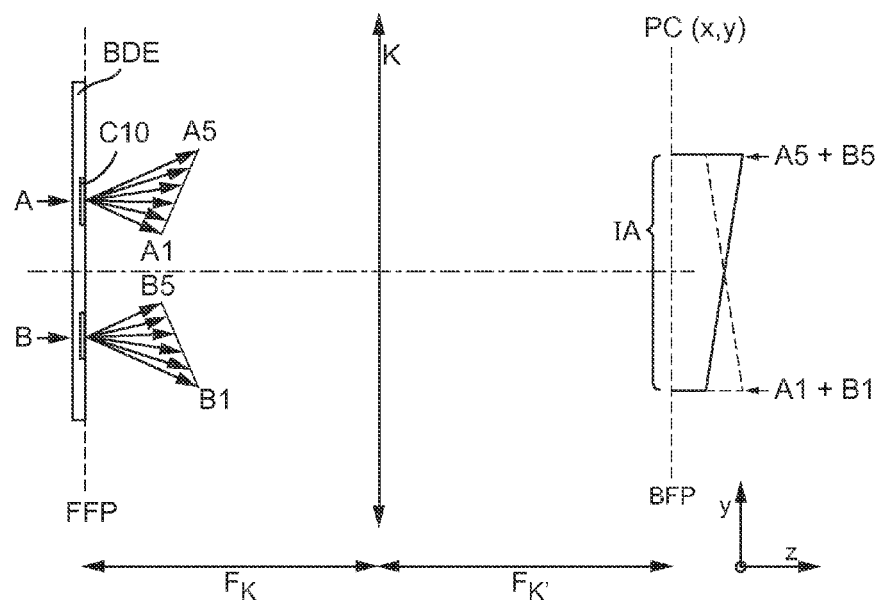
FIG. 11 shows a beam deflecting element having different types of cells having differing deflecting structures generating exiting ray bundles with differing intensity distributions.

As shown exemplarily by the beam deflecting element BDE in FIG. 11, a beam deflecting element may have different types of cells having differing deflecting structures generating exiting ray bundles with differing intensity distributions. In general, a beam deflecting element may have two or more different types of cells or two or more different groups of cells, wherein each cell of a group of cells has essentially the same diffracting structure. In the example of FIG. 11, the diffractive cell denoted by character "A" (type A cell) generates a ray bundle with a maximum intensity in propagation direction A5 and a minimum intensity in propagation direction A1 with a linear decrease of intensity between these directions. On the other hand, the cell denoted "B" located spatially separated from cell A generates an exiting ray bundle covering the same propagation directions (same diffraction angles), but with a different intensity distribution. Specifically, radiation propagating in direction B5 (parallel to direction A5) transports the smallest amount of radiation energy, whereas radiation propagating in direction B1 (parallel to direction A1) transports the largest amount of radiation energy redirected by cell B. In other words: both cells (type A and type B) generate bundles of rays having intensity in the same propagation directions, however, the distribution of radiation intensity over the propagation directions differs between the different types of cells.

Different cells located at different positions of a beam deflecting element may be considered as sources from which pencils of rays (ray bundles) are emitted, each pencil of rays being characterized by respective propagation directions and intensities travelling along the propagation directions. Radiation emitted by the different cells will overlap in the far field region of the beam deflecting element in such a way that all rays emerging from the beam deflecting element under the same propagation direction (or angle) will converge to a common single location P in a plane situated in the far field of the beam deflecting element. In other words: ray angles (or propagation directions) at the beam deflecting element transform to specific locations (or positions) in the far field. At the same time, different locations on the beam deflecting element correspond to different ray angles in the far field. In general, the far field of the beam deflecting element is characterized by a superposition of radiation energy emerging from different locations of the beam deflecting element.

A congruent superposition of radiation emitted from different locations or cells of a beam deflecting element may be obtained by placing an optical transformation system K at an appropriate position downstream of the beam deflecting element. In the arrangement shown in FIG. 11 the cells of the beam deflecting element BDE are placed in the front focal plane FFP of the optical transformation system K (having focal lengths $F_K$). A congruent superposition of radiation energy emitted from the different cells is then obtained in the back focal plane BFP of the optical transformation system. In this arrangement, the back focal plane BFP can also be denoted as "superposition plane". With $F_K$ being the focal length of the optical transformation system K, a distance between the beam deflecting element BDE and the superposition plane is twice the focal length of the optical transformation system K.

In this arrangement, the transformation performed by the optical transformation system K corresponds to a Fourier transformation and has the effect that a specific range of propagation directions (solid angle) at an emission point on the beam deflecting element BDE transforms to a specific illuminated area IA in the back focal plane BFP. This is because each propagation direction in the front focal plane transforms to a specific location P(x, y) in the back focal plane. As a consequence, a solid angle of propagation directions in the front focal plane transforms to an illuminated area in the back focal plane. In general, all partial ray bundles having the same propagation direction u(u, v) of their energetic centroids are superimposed in an area about the same location P (x, y) in the back focal plane BFP.

In general, the optical transformation system performs a Fourier transformation such that angles in the front focal plane transform into positions in the back focal plane (and vice versa), and solid angles in the front focal plane transform into areas in the back focal plane (and vice versa). This may also be expressed by the following equations:

$$P(x,y) = F_K * \sin u(x,y),$$

and $$dR(x,y) = F_K * d \sin u(x,y).$$

In these equations, the term d sin u represents the latitude (or expansion) of a ray bundle from an energetic centroid of the ray bundle and the term sin u (x, y) represents the propagation direction of the energetic centroid of the ray bundle.

Remarkably, the position of a point of origin of a ray bundle in the front focal plane (at the beam deflecting element) has no influence on the superposition of the radiation energy in the back focal plane, as long as only the amount of intensity is considered. In FIG. 11 this is indicated by the schematic diagram on the right hand side showing the distribution of intensities generated by the separate pencils of rays at A and B in the back focal plane BFP. The solid line represents the intensity distribution generated by radiation exiting cell A and the dashed line represents the intensity distribution generated by radiation exiting cell B. It is evident that the intensity contributions generated by the ray A5 with maximum intensity generated by cell A and the intensity of the ray B5 with minimum intensity generated by cell B superimpose at the same position (A5+B5) in the back focal plane. This is because rays A5 and B5 are parallel to each other, i.e. have the same propagation direction. Analogously, the rays A1 and B1, which are parallel to each other near the front focal lane, superimpose at the lower edge of the illuminated area at A1+B1. Integration over all intensities generated by the different cells leads to a uniform intensity in the illuminated area in the back focal plane in this embodiment for all points in the illuminated area. However, each location P receives different contributions to the overall intensity from different directions (angles).

Further, a relative displacement of the deflecting structures (cells A, B) and the incident radiation in a x-y-plane perpendicular to the z-direction does not change the location P (x, y) in the superposition plane (back focal plane BFP).

Figure 12A:
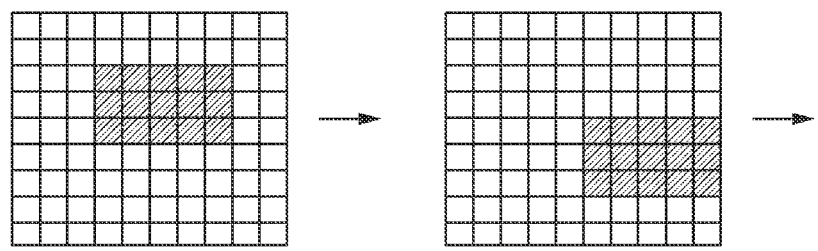
FIG. 12 shows examples of how a number of cells may be illuminated to contribute to the intensity in a back focal plane.
Figure 12B:
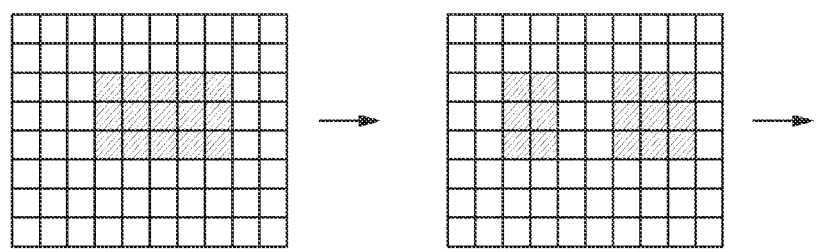

The principle of superposition exemplarily explained in connection with FIG. 11 allows for different modes of operation of a beam deflecting element. In general, the illuminated area in the back focal plane receives radiation intensity only from those cells which are illuminated by an incident radiation beam. Each illuminated cell contributes to the superposition according to its specific deflecting characteristics determined by the respective deflecting structures. The characteristics of the intensity distribution in the illuminated area in the back focal plane may be modified by selecting the numbers and types of cells which are illuminated by the incident radiation beam RB. FIG. 12 shows some examples how a number of cells C1, C1, etc. may be selected to contribute to the intensity in the back focal plane. In the example of FIG. 12A the incident radiation beam (rectangular footprint on the beam deflecting element shown with hatching) illuminates a rectangular area including 15 cells. Displacement of the beam deflecting element relative to the incident radiation and/or displacement of the incident radiation beam relative to the beam deflecting element in the x-, y-plane allows to address a different set of cells. FIG. 12B illustrates that the selection of contributing cells may also be obtained by subdividing an incident radiation beam into two or more partial beams illuminating two or more areas on the beam deflecting element, or by adding one or more additional light sources to illuminate cells in the beam deflecting element.

In embodiments explained in detail in the specification, each cell of a beam deflecting element generates radiation with propagation directions in essentially the same predefined distribution of ray angles. However, the distribution of intensities within the given distribution of propagation directions (or ray angles) is different for different types of cells. In general, the differences in intensity distribution between mutually adjacent cells or adjacent rows of cells or adjacent columns of cells are relatively small, for example, in the order between about 1% and 5%.

The following examples describe the use of beam deflecting elements having a plurality of cells, each with specific deflecting structures, wherein the distribution of ray angles (propagation directions) generated by a cell is substantially the same for all cells, but where the distribution of radiation energy (or intensity) over the rays in the predefined distribution of ray angles may differ between differing cells. Several degrees of freedom for a design remain under these limiting conditions. Firstly, the distribution of intensities over rays of a ray bundle may be adjusted by appropriately structuring the deflecting structures. Secondly, different cells may have the same or different distributions of radiation energy over the predefined propagation directions in an exiting ray bundle. Under the condition that the total radiation flux is not changed for each of the cells which is illuminated, this means that the deflecting structures may be configured to redistribute radiation intensity in a predefined way (essentially without energy loss).

Figure 13A:
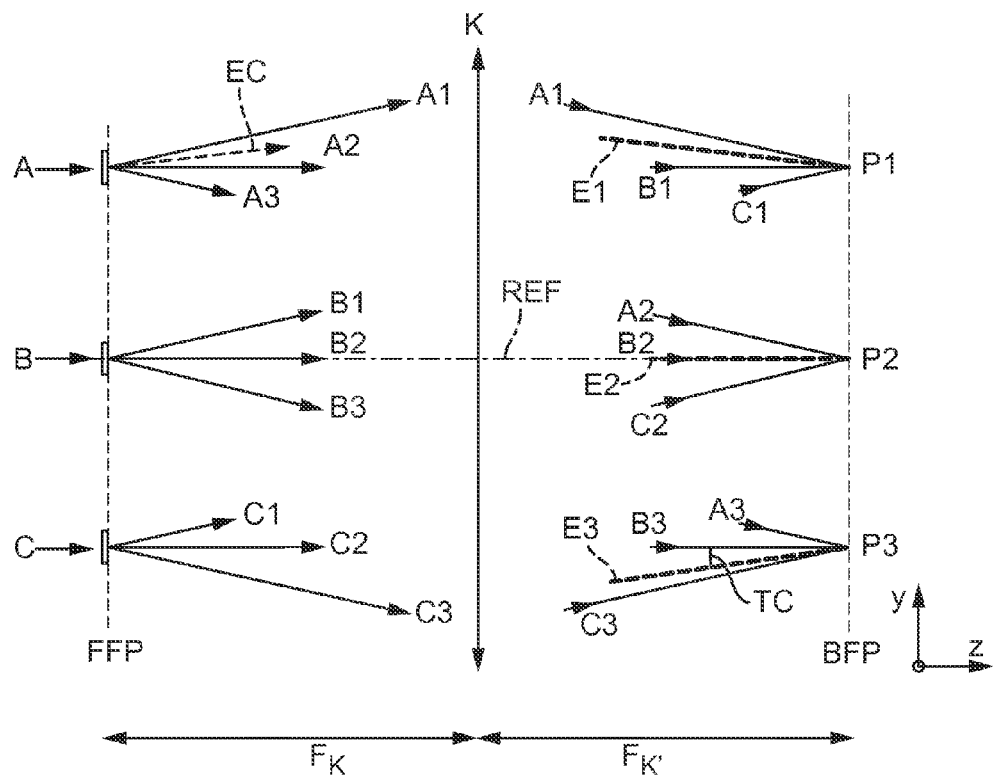
FIG. 13 shows schematically in 13A and 13B how a diffractive beam deflecting element can function as a telecentricity manipulator in an illumination system.

An embodiment of a diffractive beam deflecting element capable to function as a telecentricity manipulator in an illumination system, such as illumination system for a microlithography projection exposure apparatus, will now be described in connection with FIG. 13A, B. FIG. 13A shows schematically an optical transformation system K with focal length $F_K$ defining a front focal plane FFP and a back focal plan BFP, where the back focal plane is a Fourier transform plane relative to the front focal plane (compare FIG. 11). A diffractive beam deflecting element (diffractive optical element) is placed in a front focal plane FFP. For simplicity, only three different types of cells, namely, cell A, cell B and cell C are shown. When subject to a radiation beam essentially parallel to an optical axis defined by the optical transformation system each of the cells, if illuminated, emits a conical bundle of rays (radiation cone) which includes rays of all propagation directions generated by the respective cells. The distribution of ray angles (propagation directions) is the same for all three types of cells A, B, C. FIG. 13A shows selected rays A1, A2, A3 emitted from cell A, rays B1, B2, B3 emitted from cell B, and rays C1, C2 and C3 emitted from cell C. In the representation, the rays A1, B1, C1 (travelling upwardly in the schematic figure) are parallel to each other, i.e., they have the same propagation direction near the front focal plane. Likewise, rays A2, B2 and C2 are parallel to each other (and inclined relative to rays A1, B1, C1). Finally, rays A3, B3, C3 (travelling in downward direction in the figure) are parallel to each other.

The relative intensities travelling in the different propagation directions are indicated by the lengths of the arrows. A relatively large amount of radiation energy travels along direction A1, a smaller amount travels along direction A2 and a still smaller amount of energy travels along direction A3. The distribution of radiation energy contained in a ray bundle emerging from a common origin (or converging towards a common point) may be characterized by a hypothetical ray which may be referred to as "energetic centroid ray" or briefly as "energetic centroid" or "energetic center" of a ray bundle. The energetic centroid ray represents the average of all propagation directions present in the ray bundle, weighted by the respective amounts of energy (or intensity) travelling in the respective propagation directions. The direction of the energetic centroid may be determined analogously to the location of the centre of gravity (COG) of a solid body.

Going back to the example: the distribution of radiation energy across the conical bundle of rays emitted from cell A is asymmetric (non-symmetric), with the energy centroid EC being located somewhere between directions A1 and A2.

The intensity distribution generated by cell C is also asymmetric, but in the opposite direction such that the energetic centroid ray is running somewhere between rays C2 and C3. Finally, cell B generates a bundle of rays having an even distribution of radiation energy over all propagation directions such that the energy centroid direction runs parallel to the incident radiation (parallel to ray B2).

Figure 13B:
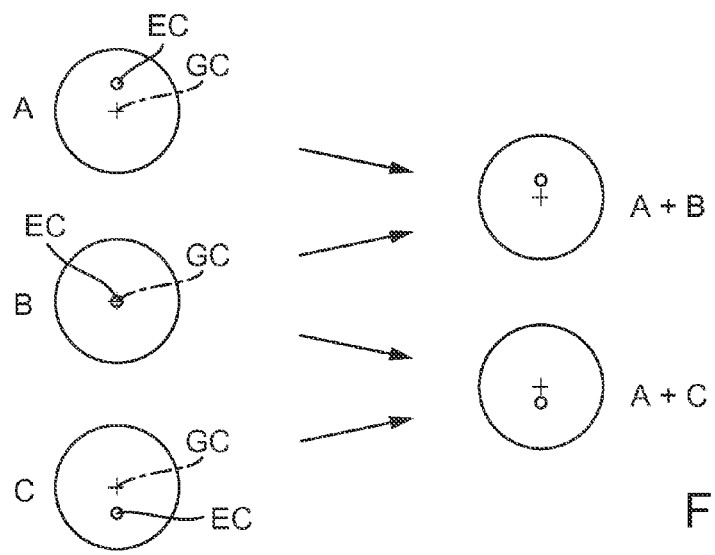

In FIG. 13B the energetic conditions in the conical ray bundles are illustrated in the left column, where reference signs A, B and C correspond to cross-section through the cones of radiation generated by cells A, B and C, respectively. The "+" sign represents the geometrical centre GC of each of the cones, which lies in the centre of the cones. The position of the energetic centroid EC is marked with a small circle in this representation.

Now, consider a case where incident radiation impinges on all three types of cells A, B and C. As explained in connection with FIG. 11, all rays travelling parallel to each other along a certain propagation direction upstream of the optical transformation system K (in the region of the tip of the cone near the front focal plane FFP) will converge towards the same position P (x, y) in the back focal plane BFP with the respective contribution to the overall intensity incident on that position. Therefore, rays A1, B1, C1 emitted from cells A, B, C laterally offset with respect to each other in front focal plane FFP are incident on a common point P1 in the back focal plane BFP. However, bearing in mind that each angle on the front focal plane transforms to a position on the back focal plane BFP, and each position at the front focal plane transforms to a specific angle at the back focal plane, it is evident that the radiation travelling in directions A1, B1, and C1 are incident on the common point P1 from different directions (i.e. at differing angles). Due to the relative intensities of the rays incident on point P1, the energetic centre E1 of the cone converging towards P1 is tilted relative to the reference direction REF and lies between the directions corresponding to rays A1 and B1. The energetic centre E1 of the cone of rays incident on point P1 is marked with a bold dashed line in FIG. 13A. In an analogous manner, radiation exiting the cells A, B and C in the diametrically opposite direction (rays A3, B3 and C3) converge towards point P3 in the back focal plane with the respective intensities, thereby generating a cone of rays having its energetic centre E3 tilted relative to the reference direction in a direction opposite to E1. The cone of rays incident on point P2 is composed of radiation contained in rays A2, B2, C2 each transporting the same amount of energy. The respective energetic centroid E2 is orientated parallel to the reference direction.

This simplified example shows that the diffractive beam deflecting element is effective to generate, in the back focal plane of the optical transformation system K, a radiation bundle where the angle or direction corresponding to the energetic centroid of radiation varies across the illuminated area IA. This corresponds to a variation of energetic telecentricity across the illuminated area. The term "energetic telecentricity" as used in this application may be used to characterize the relative orientation of the direction of the energetic centroid with respect to a reference direction. Conveniently, the reference direction may be parallel to the optical axis defined by the optical transformation system K. The telecentricity at a given location P in the back focal plane may then be expressed by a tilt angle TC defined between the direction of the energy centroid corresponding to that location, and the reference direction. In the example of FIG. 13, the telecentricity varies spatially across the illuminated area containing points P1, P2 and P3.

The example also shows that the beam deflecting element may be used as an energy distribution manipulator specifically targeted to adjust the telecentricity conditions in the illuminated area in the back focal plane (or in planes optically conjugated therewith). For example, if incident radiation is guides such that it is incident only on cells of type A and type B, the directions of the respective energetic centres will shift with respect to the situation shown in FIG. 13A where all three types of cells are illuminated. The effect of optionally selecting different subsets of cells of the beam deflecting element to generate radiation incident on an illuminated area is shown schematically in connection with the right column of FIG. 13B. In the upper circle denoted by "A+B" a superposition of radiation emitted from cells A and cells B is shown with the energetic centroid somewhere between the geometrical centre ("+" symbol) and the position of the energetic centre in pure A conditions. Analogously, the lower figure "A+C" indicates the situation with the superposition of radiation emitted from cells of types B and C, respectively.

An embodiment of a diffractive beam deflecting element (diffractive optical element) capable of being used as a variable energy distribution manipulator will now be described in connection with FIG. 14A, 14B. In this embodiment, the deflecting structures in various cells are optimized to correct or adjust ellipticity in an energy distribution. Similar to the representation in FIG. 13A, 13B, the diffractive optical element has three different types of cells designated A, B and C, which have different characteristics in terms of energy redistribution of an incident radiation beam. The directions of arrows represent the propagation direction of radiation energy contained in a partial ray bundle, and the length of the arrows represents the respective amount of intensity. Each type of cells generates a conical ray bundle, as shown in the cross-sections in the left column of FIG. 14B. Rays A1, A3, B1, B3 and C1, C3 represent radiation directions in a y-z plane. Pairs of arrows designated A2, B2 and C2 represent radiation directions in a x-z plane perpendicular thereto. The arrows are shown separately only for the purpose of illustration. As in the embodiments of FIG. 13A, 13B the geometric centre GC of the radiation cones is located in the centre of the circular cross-section. However, the intensity is not even distributed amongst all directions in the cone.

Instead, the intensity is generally higher in a central region around the geometric centre of a cone and decreases continually towards the outer edges of a radiation cone in all directions. As shown in the left column of FIG. 14B the distribution of radiation energy over the solid angle generated by cells of type B is rotationally symmetric with respect to the geometric centre GC, i.e. the intensity has a maximum value along the direction of the incident beam and decreases gradually according to the same angular function in all radial directions. On the other hand, the zones of increased intensity relative to the outer edges of a cone have a generally elliptical shape in the radiation bundles generated by cells A and C. While the long axis of the elliptical zone extends in x-direction in the radiation bundle generated by cells A, the long axis of the ellipse is oriented in y-direction in the radiation bundles generated by cells of type C. Deflecting structures in cells of type A and C generate a ray bundle having an intensity distribution having the two-fold radial symmetry about the geometric centre GC of a radiation cone, but no rotational symmetry. Further, according to the symmetry of the intensity distribution, the energetic centre EC always coincides with the geometric centre GC of the ray bundle.

In comparing the embodiments of FIGS. 13 and 14 it should be noted that the cells in FIG. 14 each generate a symmetric intensity distribution in the emitted radiation bundle, whereas the cells of the embodiment in FIG. 13 generate an asymmetric intensity distribution in such a way that the energetic centre is angularly offset to (acentric to) the geometric centre of the radiation bundle.

In the context of this application deflecting structure generate a "symmetric intensity distribution" within an emitted ray bundle if the direction of the energetic centroid coincides with the direction of the geometric centre of a radiation bundle. On the other hand, the deflecting structure is denoted as generating an "asymmetric intensity distribution" if the direction corresponding to the geometric centre of a ray bundle and a direction corresponding to the energetic centroid of a ray bundle do not coincide but lie along different directions including a finite angle there between.

Figure 14A:
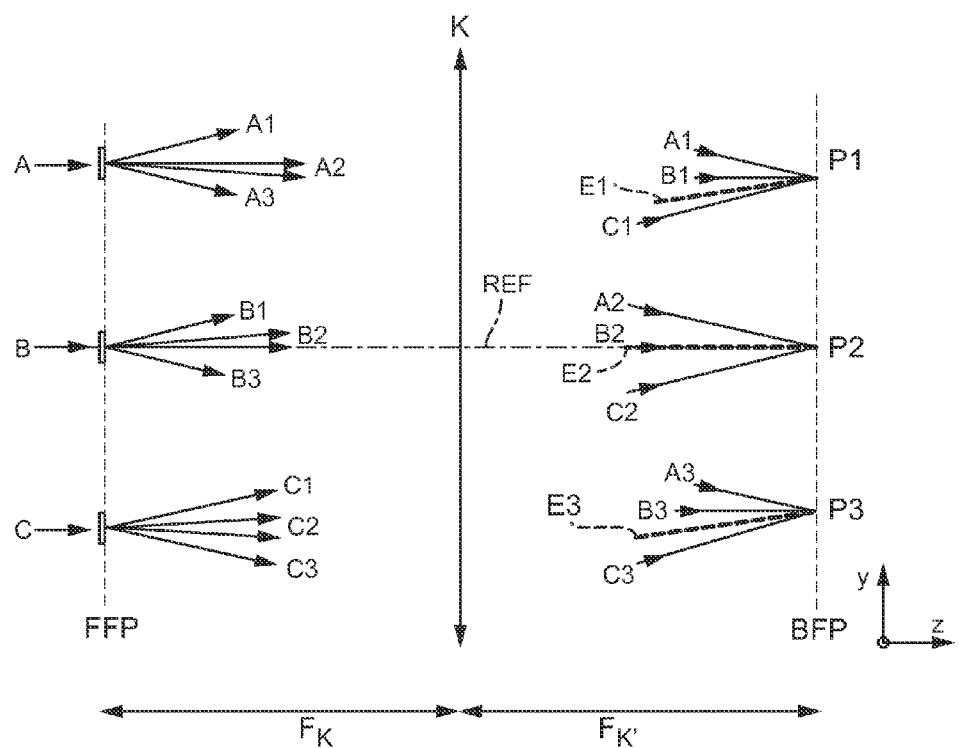
FIG. 14 shows an embodiment of a diffractive beam deflecting element capable of being used as a variable energy distribution manipulator.

The effect of superposition of radiation energy generated by different types of deflecting cells is illustrated on the right hand side of FIG. 14A, which shows the situation at the back focal plane BFP of the optical transformation system K. Like in FIG. 13A, the figure schematically shows how radiation is incident on three spatially separated points P1, P2 and P3 in the illuminated area situated in the back focal plane BFP of the optical transformation system K. Since the optical transformation system transforms propagation directions (or angles) on the entry side (front focal plane)) into locations (positions) on the exit side (back focal plane) all rays A1, B1 and C1 having the same propagation direction when exiting the beam deflecting element converge towards a common point P1 with the respective partial intensities, thereby creating a convergent cone of radiation having an energetic centre direction E1 inclined towards the z-direction due to the fact that cell C contributes relatively more energy than cells A and B. The radiation bundle converging towards point P2 is energetically symmetric such that the energetic centroid E2 is parallel to the z-direction. Owing to the fact that the relative intensities contained in rays C1 and C3 generated by cell C have the same magnitude and also the relative intensities in rays A1 and A3 generated by cell A have the same intensity, the energetic distribution in the ray bundle converging towards point P3 is the same as the energetic distribution in the ray bundle converging towards point P1. This causes the direction of the energetic centroid E3 in the ray bundle converging towards point P3 to be parallel to the energetic centroid E1 in the ray bundle converging towards point P1 (i.e. E1∥E3). In other words: the telecentric conditions in the radiation incident on the back focal plane in the embodiment of FIG. 14A are the same at the outer edges of the illuminated area (at P1 and P3). Therefore, telecentricity varies only a little across the illuminated area in the back focal plane. In contrast, there is a relatively large local variation in telecentricity in the embodiment of FIG. 13 generated by the asymmetric cells.

Figure 14B:
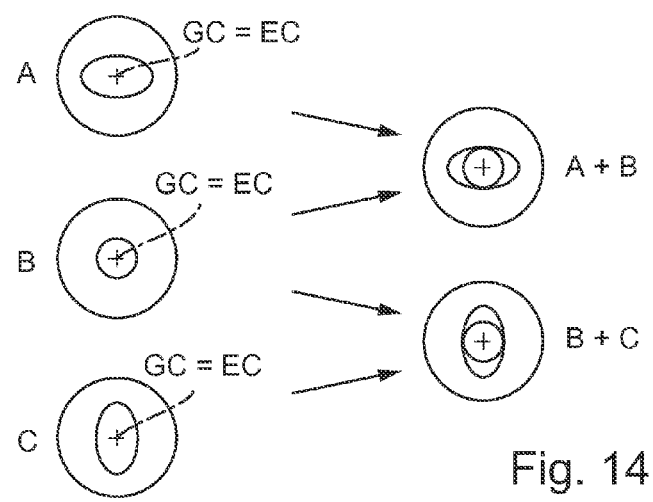

FIG. 14B shows various superpositions of intensity depending on which kind of cells are illuminated in the beam deflecting element. For example, if only cells of type A and type B are illuminated, the superimposed intensity (A+B) resembles an elliptic zone extending with the long axes in x-direction. Superimposing radiation from cells B and C will result in an elliptic distribution B+C having the longer axis extending in y-direction. Other combinations are possible.

FIG. 14B schematically illustrates that the shape or form of the generated intensity distribution may gradually change from cell to cell. The variation in intensity distribution shape may occur in horizontal and/or vertical direction, i.e. along rows and/or columns of a two-dimensional array of cells. In the embodiment, the ellipticity character of the partial solid angle region with relatively increased intensity changes between cells of different type A, B and C. It goes without saying that a smaller number or a larger number of cells of different types may be present in a beam deflecting element. Depending on the type and amount of cells of each type of cells actually illuminated in a specific situation to generate exiting radiation a "morphing effect" maybe obtained. The energy distribution within a given solid angle range of radiation may be varied by selecting which type of cells and how many cells of each type are illuminated with incident radiation. This makes it possible to create an energy distribution manipulator capable to vary the energy distribution within a predefined range of angles (or propagation directions) at which radiation energy propagates through an optical system.

Figure 15:
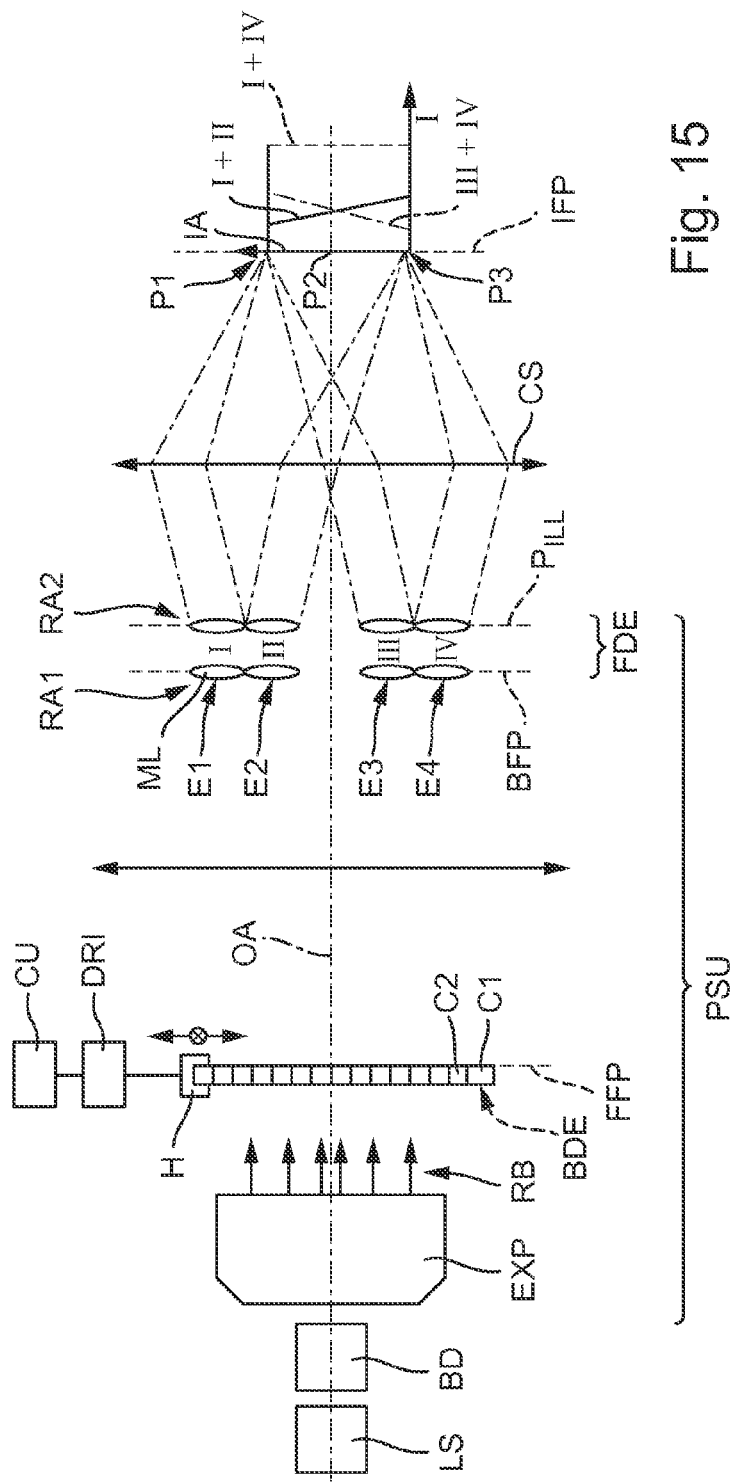
FIG. 15 shows schematically a part of an embodiment of an illumination system including a beam deflecting element.

FIG. 15 illustrates schematically a part of an embodiment of an illumination system which may be used, for example, in a projection exposure system for microlithography. The general layout may be similar to the corresponding parts of the illumination system ILL described in detail in connection with FIG. 4. For the sake of simplicity, corresponding components or groups are designated with the same reference identifications. The components shown in FIG. 15 act in combination to transform radiation emitted by a primary light source LS, such as an excimer laser, and to generate in an intermediate field plane IFP of the illumination system and illuminated area IA (illumination field) with predefined characteristics with respect to the distribution of illumination intensity I and with respect to the directions from which illumination intensity is incident onto the illuminated area.

As in the embodiment of FIG. 4, the illumination system includes a pupil shaping unit PSU to create an effective source formed by a predefined spatial intensity distribution in the pupil plane $P_{ILL}$ of the illumination system. The pupil plane $P_{ILL}$, where the effective source is formed, is a Fourier transform surface with respect to the intermediate field plane IFP, which, in turn, is in optically conjugate position with respect to the object surface of the projection objective (not shown) where the mask (reticle) of a microlithography process is situated. A condenser system CS is provided to perform the Fourier transformation. The components downstream of the intermediate field plane IFP may be similar to those shown in FIG. 4.

The radiation emitted by the light source LS is guided by a beam delivery system BD into a beam expansion unit EXP which forms an exiting radiation beam RB composed of substantially collimated radiation with all rays propagating essentially parallel to the optical axis OA of the illumination system. The radiation beam RB is incident on a transparent optical beam deflecting element BDE formed by a diffractive optical element (DOE). The diffractive optical element includes a two-dimensional raster arrangement (rows and columns) of small cells C1, C2 etc. each having a predefined diffraction grating structure acting as a deflecting structure to deflect radiation essentially without energy loss into desired propagation directions optically downstream of the beam deflecting element.

The diffractive beam deflecting element BDE is received in an exchange holder H associated with a drive system DRI controlled by a control unit CU of the projection exposure apparatus. The drive system is configured to shift the beam deflecting element continuously in an x-y-plane perpendicular to the optical axis OA relative to the incident radiation beam. Movement of the diffractive optical element therefore allows to select which group (or groups) of cells are placed into the radiation beam and thereby contribute to the illumination radiation incident on the illuminated area.

The beam deflecting element is positioned in a front focal plane FFP of an optical transformation system K which collimates the diverging radiation emerging from the diffractive beam deflecting element. The optical transformation system may include a zoom system, optionally with and a pair of axicon elements, or may have different design, such as an optical transformation system with fixed focal length with or without axicon elements. As explained in detail in connection with FIGS. 13 and 14, the optical transformation system performs a Fourier transformation to transform ray angles (propagation directions) of radiation exiting the diffractive optical element in the front focal plane into positions in the back focal plane BFP of the optical transformation system, and locations in the front focal plane into propagation directions (angles) in the back focal plane BFP.

A first raster array RA1 of a field defining element FDE is arranged at or close to the back focal plane of the optical transformation system. The first raster array RA1 includes a plurality of first raster elements in the form of microlenses ML each with positive optical power. The raster elements are arranged in rows and columns and placed directly adjacent to each other substantially without gaps in between. The meridional section in FIG. 15 shows four microlenses of a column in y-direction. The microlenses have rectangular shape with non-unity aspect ratio corresponding to the rectangular shape desired for the illuminated area IA.

The field defining element includes a second raster arrangement RA2 of second raster elements in the form of micro lenses with positive optical power arranged at or close to the pupil surface $P_{ILL}$ of the illumination system, which is a Fourier transform plane to the back focal plane where the first raster array RA1 is situated. The first and second raster arrays RA1 and RA2 are components of the field defining element FDE and form a plurality of optical channels I, II, III, IV defined by corresponding micro lenses in the raster arrays. The field defining element FDE is therefore essentially constructed like a fly's eye condenser. In real embodiments, a field defining element may have a large number of optical channels, such as several hundreds of optical channels.

The microlenses of the second raster array RA2 together with the condenser system CS image the microlenses of the first raster array RA1 into the intermediate field plane IFP, with the images of the individual first raster elements being superimposed (overlapped completely) in the intermediate field plane. A light mixing effect of an optical integrator is thereby obtained.

As explained in connection with FIGS. 13 and 14 the specific design of the deflecting structures in the diffractive beam deflecting element allow to determine the directions of the energetic centroids of the radiation incident on points in the back focal plane BFP of the optical transformation system. Further, the incident directions may be varied by appropriately selecting which kinds of cells are illuminated and thereby used to generate the radiation incident on the back focal plane. It will now be explained how these functionality allows to influence the characteristics of the illumination intensity in the illuminated area IA.

In the example, the beam deflecting element may have cells generating an asymmetric intensity distribution similar to that explained in connection with FIG. 13. Therefore, optical channels I and II are subject to radiation where the direction of the energetic centroids E1, E2 includes a finite angle with the optical axis OA such that the radiation enters the optical channel obliquely. An opposite tilt of the direction of the energetic centroids E3, E4 is generated for channels III and IV arranged on the opposite side of the optical axis.

The microlenses arranged sequentially in each of the channels and the associated portion of the condenser system arranged downstream thereof do not form ideal (aberration-free) imaging systems. Instead, the optical action differs depending on whether an incident partial beam travels essentially parallel to the optical axis or is substantially inclined to the optical axis. Whereas an incident partial beam travelling essentially parallel to the optical axis will generate an intensity distribution in the illuminated area which is essentially constant across the entire illuminated area, a gradient of intensity provided by an optical channel will generally be generated if the incident radiation enters the optical channel obliquely, i.e. under a finite angle with respect to the optical axis. A detailed description of these effects is given in patent application US 2009/0021715 A1, specifically in connection with FIGS. 1 to 6 thereof. The respective information is incorporated herein by reference.

In the exemplary embodiment of FIG. 15, the radiation passing through optical channels I and II will contribute to the overall intensity distribution in the illuminated area with a partial intensity having a gradient across the illuminated area, with a minimum value of intensity at the upper edge and a maximum value of intensity at the lower edge of the illuminated area (solid line I+II). On the other hand, the radiation entering the third and forth channels III and IV tilted towards the opposite direction with respect to the optical axis will generate a gradient having a maximum value at the upper edge of the illuminated area and a minimum value at the lower edge (dash-doted line III+IV). The gradients may be linear in both cases.

Owing to the superposition of intensities in the illuminated area IA, the overall intensity across the illuminated area is constant over all location in the illuminated area, as indicated by dashed line I-IV. However, the intensity contributions received at each location in the illuminated area vary across the illuminated area in terms of the illumination direction (or channel) from which the intensity is incident. For example, field point P1 at the upper edge receives relatively more energy from channels III and IV than from channels I and II. The opposite is true for field point P3 at the lower edge. The central point P2 receives essentially the same energy contributions from all channels (i.e. directions). Therefore, the direction (or angle) of the energetic centroid in the illuminated area vary spatially across the illuminated field, which means that there is a spatial variation of the (energetic) telecentricity conditions across the illuminated field. In other words: the overall intensity in the illuminated area is essentially constant across the entire illuminated area, however the angular distribution of intensity varies spatially across the illuminated area.

It is to be noted that the directions of the energetic centroids E1 to E4 of the radiation incident in the back focal plane shown in FIG. 15 are only used as an example given for the specific position of the beam deflecting element BDE and occur in response to the selection of cells which are illuminated, i.e. the selection of a deflecting region. Adjustments to the angular distribution of energy over the directions under which the back focal plane is illuminated may be effected by illuminating a different set of cells of the same beam deflecting element (i.e. another deflectin region) without changing the spatial distribution of intensity in the pupil plane $P_{ILL}$ of the illumination system, i.e. without changing the illumination setting. Therefore, the energetic telecentricity properties of the illumination radiation incident on the illuminated area IA may be changed in a targeted fashion by displacing the beam deflecting element relative to the position shown in FIG. 15 such that a different set of cells is illuminated (compare FIG. 6).

Figure 16:
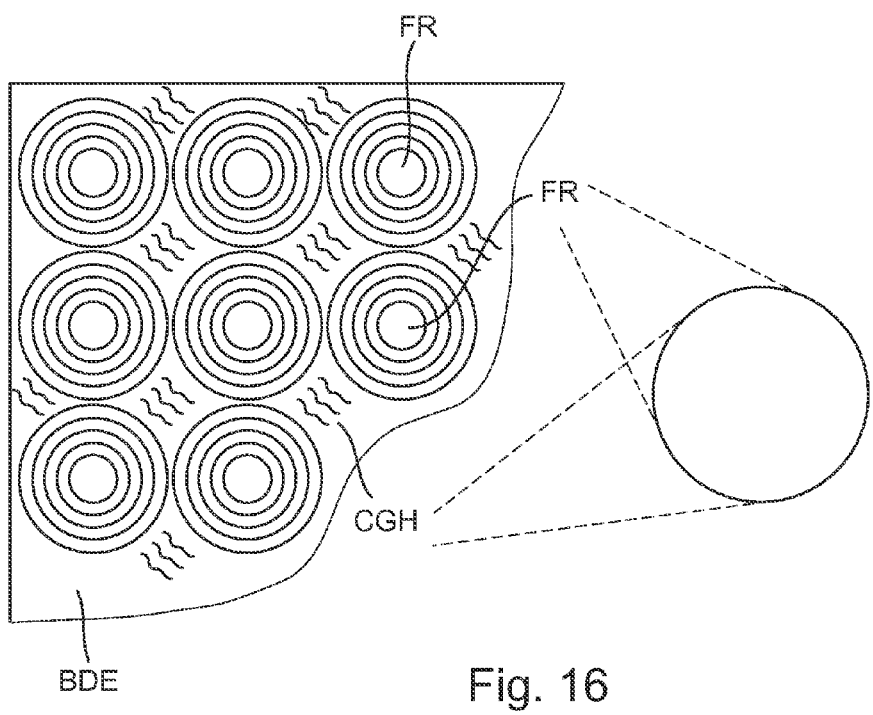
FIG. 16 shows an embodiment of a transparent beam deflecting element including Fresnel zone structures and computer generated hologram structures (CGH structures) formed in interspaces between the Fresnel zone structures

FIG. 16 shows another embodiment of a transparent beam deflecting element BDE which may be used as an energy distribution manipulator. The beam deflecting element includes a plurality of circular Fresnel zone structures FR arranged in a regular two-dimensional array consisting of rows and columns of identical Fresnel zone structures. Diamond-shaped interspaces are formed between the circular Fresnel zone structures. Computer generated hologram structures CGH, also denoted as CGH structures, are formed on the body of the beam deflecting element in the interspaces between the Fresnel zone structures. The beam deflecting element has a plate-like body made of fused silica or calcium fluoride or another material sufficiently transparent for the incident ultraviolet radiation. The Frensel zone structures and the CGH structures may be formed on one side of the transparent body by appropriate fine structuring process, such as a lithographic process. More than 50% of the over-all useful area of the beam deflecting element is covered with diffractive Fresnel zone structures.

The Fresnel zone structures and the CGH structures both are diffractive deflecting structures effective to generate, from an incident radiation beam, a circular spatial intensity distribution in the far field of the beam deflecting element (see right side of FIG. 16). Therefore, when the beam deflecting element is incorporated appropriately in a pupil shaping unit, conventional illumination with a predefined coherence factor is generated by the beam deflecting element.

The combination of Fresnel zone structures and CGH structures covering entirely an illuminated region of a beam deflecting element may be advantageous to increase the efficiency (or transmission) of the beam deflecting element when compared to diffractive beam deflecting element including only CGH structures. This may be understood from the following considerations. Studies show that, for example, diffractive Fresnel structures of the phase-step type with eight levels of phase thickness in the ring zones may reach a theoretical maximum efficiency of about 94%. The term efficiency as used here describes the proportion of intensity in the diffracted beam divided by the proportion of energy in the incident beam. On the other hand, 8-level CGH structures theoretically reach a maximum efficiency of about 90%. Therefore, it is contemplated that employing Fresnel zone structures increases the over-all efficiency (or transmission) of the beam deflecting element. Therefore, a combination of Fresnel zone structures and CGH structures may increase the over-all efficiency of the beam deflecting element when compared to diffractive beam deflecting element having CGH structures only. On the other hand, providing CGH structures in addition to Fresnel zone structures allows for increased flexibility with regard to the energy distribution within the geometric distribution of ray angles generated by the beam deflecting element, which allows to fine-tune the spatial intensity distribution in the pupil surface of an illumination system, for example.

FIG. 17 shows in 17A and 17B two examples of portions of an illumination system including beam diffractive elements BDE according to embodiments discussed above in combination with particular set-ups to provide incident radiation including a plurality of partial beams PB, each partial beam being associated with a particular cell or zone of the beam deflecting element. The arrangements each include a light source arrangement LSA including multiple light sources LS1, LS2, . . . etc. which can be controlled independently from each other by a light source controller not shown in the figures. In the embodiment each individual light source LS1, LS2, LS3 etc. of the multiple light source is a high efficiency light emitting a diode (LED) which can be controlled between a switched-on configuration (indicated by a rectangle filled with X) and a switched-off configuration (indicated by empty rectangles). A micro lens array MLA is arranged between the multiple light source and the beam deflecting element such that a single lens of the micro lens array collects radiation from one of the plurality of light sources and forms a partial beam PB incident essentially only onto one of the cells or zones of the beam deflecting element. An individual light source may also be associated with a subset of cells of the beam deflecting element, wherein a subset includes two or more single cells.

Figure 17A:
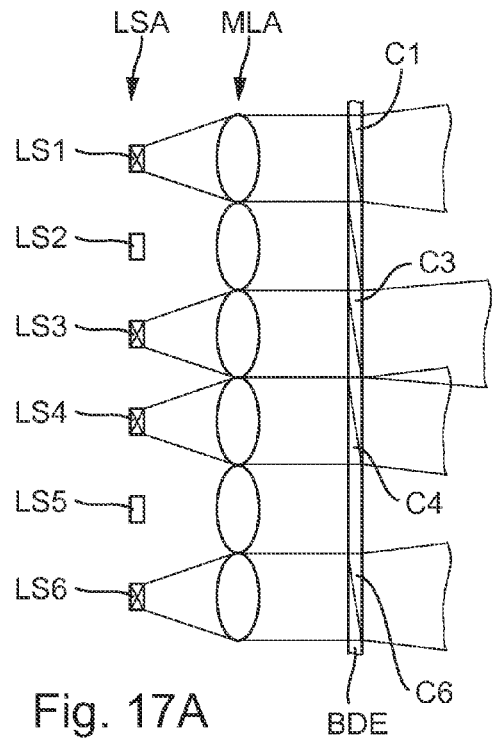
FIG. 17 shows in 17A and 17B examples of portions of illumination systems including multiple light sources and beam deflection elements illuminated by a plurality of partial beams.

In the situation shown in FIG. 17A first, third, fourth and sixth individual light source LS1, LS3, LS4 and LS6 are switched on, whereas the other light sources LS 2 and LS4 are switched off. Therefore, only cells or cell groups C1, C3, C4 and C6 of the beam deflecting element contribute to the radiation exiting the beam deflecting element and form, in combination, a first deflecting region actively used at the depicted instant in time.

Each of the cells C1, C2 etc. is effective to generate the same geometric distribution of ray angles in the exiting partial beam. However, the cells or groups of cells differ with respect to the intensity distribution over the rays of the geometric ray angle distribution. Therefore, the optical beam deflecting element is effective as an energy distribution manipulator depending on which group of cells are illuminated by the multiple light source at a given instant of time.

Figure 17B:
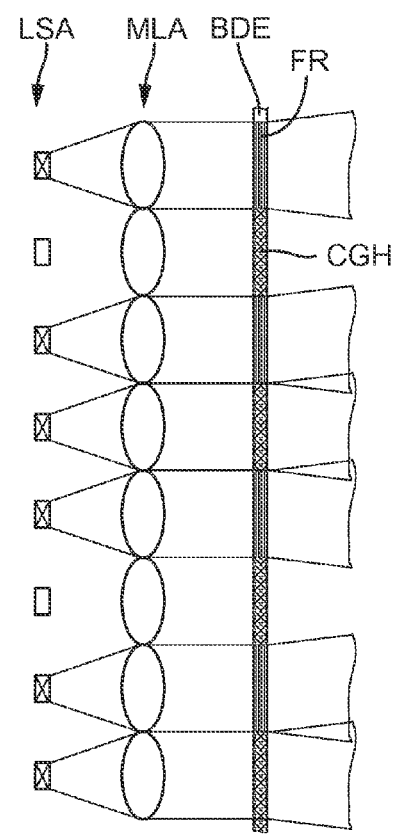

While FIG. 17A shows an embodiment of a beam deflecting element where all single cells are made of the same type of deflecting structure (diffraction grating, CGH structure or Fresnel zone structure, for example) the beam deflecting element in FIG. 17B is of the general type shown in FIG. 16 combining cells with Fresnel zone structures FR and regions with CGH structures in interspaces between Fresnel zone structures.

In general, arrangements combining a multiple light source with individually addressable single light sources in combination with a beam deflecting element allows to switch very fast between different energy distributions within a given setting. Switching times may be in the order of 5 ms or less, for example. This is partly due to the fact that the beam deflecting element need not be mechanically moved to switch between different configurations.

The use of a plurality of light emitting diodes in the multiple light source or light source arrangement LSA is only an example. Other multiple light sources are possible. For example, radiation from a single incident laser beam may be separated by an appropriate beam separator into a plurality of partial beams which may be focussed to form second light sources acting as the light sources of the multiple light source. Single cells or sub groups of cells of the beam deflecting element can then be addressed individually by switching on or switching off one or more of the secondary light sources, e.g. by using appropriate shutters.

Figure 18:
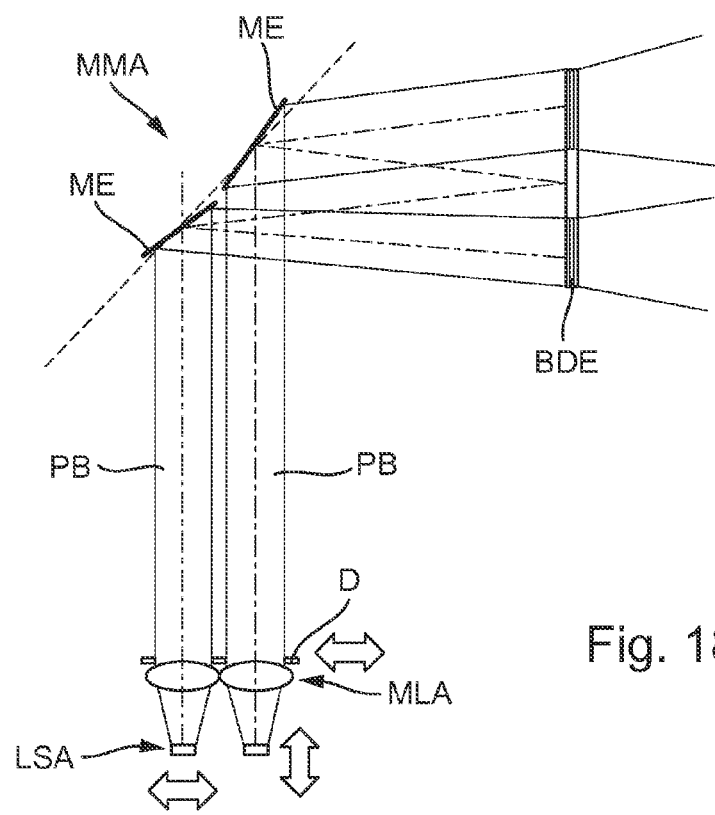
FIG. 18 shows an arrangement allowing to address single cells or sub groups of cells of a beam deflecting element separately by guiding partial beams of incident radiation on the respective cells or cell groups.

FIG. 18 shows another arrangement allowing to address single cells or sub groups of cells of a beam deflecting element BDE separately by guiding partial beams PB of incident radiation on the respective cells or cell groups. Incident radiation is provided by a multiple light source, or light source arrangement LSA, including, for example, a plurality of individually controllable light emitting diodes or by secondary light sources generated from a common incident laser beam. A micro lens array MLA having a lens or lens group associated with each of the single light sources generates a plurality of collimated partial beams PB with rays essentially parallel to a common optical axis. A diaphragm D providing an aperture with variable diameter for each of the partial beams may be used to control the overall brightness of each of the partial beams separately. Each partial beam is guided onto one of a plurality of tiltable mirror elements ME of a multiple mirror array MMA inclined by 45° relative to the optical axis on the light incidence side. The multiple mirror array includes a two-dimensional array of micro mirrors, wherein each of the micro mirrors can be tilted in controllable fashion in two directions to control the direction of the partial beam reflected by the individual mirror. Multiple mirror arrays of this type are known in the art and are therefore not explained in detail here.

In the embodiment of FIG. 18 the multiple mirror array is arranged between the multiple light source and the beam deflecting element such that it is possible to select which of the single cells or sub groups of cells of the beam deflecting element are illuminated at a given instant in time by a given single light source of the light source arrangement to contribute to the overall radiation exiting the beam deflecting element. In other words: there is a variable allocation possible between each single light source and the cells addressable in the beam deflecting element.

As in the embodiments of FIG. 17, the beam deflecting element is mounted in a fixed position, and switching between different energy distributions within the exiting ray bundle is effected by controlling the reflecting angle of the individual mirrors of the multiple mirror array MMA. In addition, the direction and focus of the partial beams incident on the multiple mirror array can be adjusted by moving the positions of the light sources LS1, LS2 relative to the associated lenses or lens systems of the micro lens array MLA as indicated by the double arrows. Arrangements of the type exemplarily shown in FIG. 18 may be used in combinations with beam deflecting elements including only one type of deflecting structures (such as CGH structures or Fresnel zone structures) or with beam deflecting elements including a combination of different types of deflecting structures, such as shown in FIG. 16.

The arrangements including multiple light sources are examples of variable arrangements effective to generate a plurality of partial beams forming an arrangement of illumination spots on the beam deflecting element to illuminate selected regions of the beam deflecting element, wherein the arrangement is variably controllable in such a way that differing selected regions on the beam deflecting element are illuminated in differing operation modes of the arrangement. A selection between different modes of operation of the beam deflecting element utilizing differing deflecting regions can be made, for example, by selecting which of the individual light sources are energized at a given time and/or by selecting the properties of the individually controllable elements of a spatial light modulator, such as the mirrors of the multiple mirror array of FIG. 18.

Aspects of the disclosure have been described in detail using a dipolar illumination setting as an example. Dipole illumination is often used to print fine periodic line structures running in one direction only. Other illumination settings optimized for other pattern structures may also be generated and modified. Examples for other typical mask structures often used in microlithographic processes and corresponding illumination settings adapted to these structures are disclosed in US 2008/0013065 A1. The respective disclosure of this document is incorporated in the present application by reference.

The terms "radiation" and "light" used herein are interchangeable and encompass different types of electromagnetic radiation, including ultraviolet (UV) radiation (e.g. having wavelengths of about 365 nm, 248 nm, 193 nm, 157 nm or 126 nm).

The above description of the preferred embodiments has been given by way of example. From the disclosure given, those skilled in the art will not only understand the present disclosure and its attendant advantages, but will also find apparent various changes and modifications to the structures and methods disclosed. The applicant seeks, therefore, to cover all such changes and modifications as fall within the spirit and scope of the disclosure, as defined by the appended claims, and equivalents thereof.

What is claimed is:

1. An optical beam deflecting element, comprising:
   first deflecting structures in a first region of the optical beam deflecting element, the first deflecting structures being configured to generate a bundle of first rays when a radiation beam is incident on the first deflecting structures, each of the first rays having a propagation direction corresponding to a ray angle within a first distribution of ray angles, the bundle of first rays encompasses the entire first distribution of ray angles, the first rays having intensities according to a first intensity distribution; and
   second deflecting structures in a second region of the optical beam deflecting element, the second region being laterally offset from the first region, the second deflecting structures being configured to generate a bundle of second rays when the radiation beam is incident on the second deflecting structures, each of the second rays having a propagation direction corresponding to a ray angle within a second distribution of ray angles, the bundle of second rays encompasses the entire second distribution of ray angles, the second rays having intensities according to a second intensity distribution which is different from the first intensity distribution, wherein the first distribution of ray angles is identical to the second distribution of ray angles.

2. The optical beam deflecting element of claim 1, further comprising third deflecting structures in a third region of the optical beam deflecting element, wherein:

the second region is adjacent a first side of the first region;
the third region is adjacent a second side of the first region which is opposite the first side of the first region; and
the third deflecting structures are configured to generate a bundle of third rays when the radiation beam is incident on the third deflecting structures, each of the third rays having a propagation direction corresponding to a ray angle within a third distribution of ray angles, the bundle of third rays encompasses the entire third distribution of ray angles, the third rays having third intensities according to a third intensity distribution which is different from both the first and second intensity distributions, the third distribution of ray angles is identical to the first and second distributions of ray angles.

3. The optical beam deflecting element of claim 2, wherein the second deflecting structures influence an energy distribution parameter defined by the angular distribution in a first way, and the third deflecting structures influence the energy distribution parameter defined by the angular distribution in a second way which is opposite the first way.

4. The optical beam deflecting element of claim 3, wherein the energy distribution parameter defined by the angular distribution comprises at least one energy distribution parameter selected form the group consisting of pole balance, ellipticity, gradient, and telecentricity.

5. The optical beam deflecting element of claim 2, further comprising fourth deflecting structures in a fourth region of the optical beam deflecting element, wherein:
the fourth region is adjacent a third side of the first region, the third side of the first region being transverse to the first side of the first region; and
the fourth deflecting structures are configured to generate a bundle of fourth rays when the radiation beam is incident on the fourth deflecting structures, each of the fourth rays having a propagation direction corresponding to a ray angle within a fourth distribution of ray angles, the bundle of fourth rays encompasses the entire fourth distribution of ray angles, the fourth rays having fourth intensities according to a fourth intensity distribution which is different from each of the first, second and third intensity distributions, the fourth distribution of ray angles is identical to the first, second, and third distributions of ray angles.

6. The optical beam deflecting element of claim 5, further comprising fifth deflecting structures in a fifth region of the optical beam deflecting element, wherein:
the fifth region is adjacent a fourth side of the first region, the fourth side of the first region being opposite the third side of the first region;
the fifth deflecting structures configured to generate a bundle of fifth rays when the radiation beam is incident on the fifth deflecting structures, each of the fifth rays having a propagation direction corresponding to a ray angle within a fifth distribution of ray angles, the bundle of fifth rays encompasses the entire fifth distribution of ray angles, the fifth rays having fifth intensities according to a fifth intensity distribution which is different from each of the first, second, third and fourth intensity distributions, the fifth distribution of ray angles is identical to the first, second, third, and fourth distributions of ray angles.

7. The optical beam deflecting element of claim 6, wherein the fourth deflecting structures influence an energy distribution parameter defined by the angular distribution in a first way, and the fifth deflecting structures influence the energy distribution parameter defined by the angular distribution in a second way which is opposite the first way.

8. The optical beam deflecting element of claim 1, wherein the first and second distributions of ray angles correspond to a multipolar spatial intensity distribution in a far field of the beam deflecting element, and the first and second intensity distributions differ in at least one parameter selected from the group consisting of a pole balance, an ellipticity, a gradient, and a telecentricity.

9. The optical beam deflecting element of claim 1, comprising:
a plurality of first regions arranged at spaced apart positions, the plurality of first regions being in a first arrangement; and
a plurality of second regions arranged at spaced apart positions between the first regions, the plurality of second regions being in a second arrangement.

10. The optical beam deflecting element of claim 9, wherein the first and second arrangements are periodic raster arrangements, and/or wherein a relative spatial distribution of first regions in the first arrangement is substantially the same as a relative spatial distribution of second regions in the second arrangement.

11. The optical beam deflecting element of claim 1, wherein the optical beam deflecting element comprises diffractive structures to redirect radiation by diffraction rather than refraction.

12. The optical beam deflecting element of claim 1, wherein the optical beam deflecting element comprises an array of Fresnel zone structures and a plurality of diffractive CGH structures between the Fresnel zone structures.

13. A system comprising:
a plurality of optical elements configured to receive primary radiation emitted from a primary light source and to generate illumination radiation incident on a mask bearing a pattern,
wherein at least some of the plurality of the optical elements define a pupil shaping unit configured to generate a spatial intensity distribution corresponding to an illumination mode in a pupil surface of the system, the pupil-shaping unit comprises an optical beam deflecting element according to claim 1, and the system is an illumination system.

14. The system of claim 13, wherein the optical beam deflecting element is configured to vary an energy distribution within a spatial intensity distribution in the pupil surface of the system substantially without changing a shape, a size and a position of illuminated areas in a pupil plane of the system.

15. The system of claim 14, and wherein the energy distribution parameter comprises at least one energy distribution parameter selected from the group consisting of pole balance, ellipticity, gradient, and telecentricity.

16. The system of claim 13, further comprising a drive system configured to controllably move the optical beam deflecting element in a direction transverse to an optical axis of the illumination system relative to an incident radiation beam so that the incident radiation beam illuminates one or more regions of the optical beam deflecting element and differing regions are addressable by actuating the drive system.

17. The system of claim 13, wherein the illumination system comprises a variable arrangement configured to generate a plurality of partial beams defining an arrangement of illumination spots on the optical beam deflecting element to illuminate regions of the optical beam deflecting element, and wherein the arrangement is variably controllable so that differing regions on the optical beam deflecting element are illuminated in differing operation modes of the arrangement.

18. The system of claim 17, wherein the arrangement comprises a plurality of light sources which are controlled independently from each other by a light source controller.

19. The system of claim 13, wherein the pupil shaping unit comprises a beam separator configured to separate an incident radiation beam into a plurality of partial beams forming a periodic raster arrangement of spatially separate illumination spots on the optical beam deflecting element.

20. The system of claim 13, wherein the pupil shaping unit comprises a zoom lens group configured to provide a continuously variable magnification.

21. The system of claim 13, wherein the pupil shaping unit comprises an axicon system comprising a pair of axicon elements having axicon surfaces, one of the axicon elements in the pair is concave, the other axicon element in the pair is one convex, and at least one of the axicon elements is movable along an optical axis of the illumination system to allow adjusting a distance between the axicon surfaces.

22. A projection exposure apparatus, comprising:
a light source configured to generate primary radiation;
an illumination system configured to guide the primary radiation along an illumination path to generate illumination radiation incident on a mask bearing a pattern; and
a projection objective configured to project an image of the pattern onto a radiation-sensitive substrate with projection radiation guided along a projection path,
wherein the illumination system comprises a pupil-shaping unit comprising an optical beam deflecting element according to claim 1.

23. A method, comprising:
arranging an optical beam deflecting element according to claim 1 in a radiation path between a light source associated with the illumination system and a pupil plane of the illumination system to generate a predefined spatial intensity distribution in the pupil plane; and
generating a relative displacement between a radiation beam incident on the optical beam deflecting element and the optical beam deflecting element so that in a first mode of operation a first region of the optical beam deflecting element is illuminated, and in a second mode of operation a second region of the optical beam deflecting element is illuminated, the first region being different from the second region,
wherein during the method an energy distribution within a spatial intensity distribution in the pupil plane of the illumination system is varied substantially without changing the shape and size and position of illuminated areas in the pupil plane.

24. An optical beam deflecting element, comprising:
first deflecting structures in a first region of the optical beam deflecting element, the first deflecting structures being configured to generate a bundle of first rays when a radiation beam is incident on the first deflecting structures to produce an effected illumination mode, each of the first rays having a propagation direction corresponding to a ray angle within a distribution of ray angles of the effected illumination mode, the first rays having intensities according to a first intensity distribution; and
second deflecting structures in a second region of the optical beam deflecting element, the second region being laterally offset from the first region, the second deflecting structures being configured to generate a bundle of second rays when the radiation beam is incident on the second deflecting structures to produce the effected illumination mode, each of the second rays having a propagation direction corresponding to a ray angle within the distribution of ray angles of the effected illumination mode, the second rays having intensities according to a second intensity distribution which is different from the first intensity distribution.

* * * * *